United States Patent [19]

Okamoto et al.

[11] Patent Number: 5,757,409
[45] Date of Patent: *May 26, 1998

[54] EXPOSURE METHOD AND PATTERN DATA PREPARATION SYSTEM THEREFOR, PATTERN DATA PREPARATION METHOD AND MASK AS WELL AS EXPOSURE APPARATUS

[75] Inventors: Yoshihiko Okamoto, Ohme; Haruo Yoda, Hinode-machi; Ikuo Takada, Mikanohara-machi; Yukinobu Shibata, Juuou-machi; Akira Hirakawa, Katsuta; Norio Saitou, Tokorozawa; Shinji Okazaki, Urawa; Fumio Murai, Hinode-machi, all of Japan

[73] Assignee: Hitachi, Ltd., Tokyo, Japan

[*] Notice: The term of this patent shall not extend beyond the expiration date of Pat. No. 5,557,314.

[21] Appl. No.: 644,089

[22] Filed: May 10, 1996

Related U.S. Application Data

[63] Continuation of Ser. No. 77,411, Jun. 16, 1993, Pat. No. 5,557,314.

[30] Foreign Application Priority Data

Jun. 16, 1992 [JP] Japan .................................. 4-156512

[51] Int. Cl.$^6$ .................................................. B41J 2/435
[52] U.S. Cl. .................................................. 347/230
[58] Field of Search .................................. 347/230, 227; 346/112, 107.6, 107.1; 250/396 ML, 492.2, 396 R

[56] References Cited

U.S. PATENT DOCUMENTS

| | | | |
|---|---|---|---|
| 4,213,053 | 7/1980 | Pfeiffer | 250/492.2 |
| 4,585,943 | 4/1986 | Yasuda et al. | 250/396 R |
| 4,586,141 | 4/1986 | Yasuda et al. | 364/490 |
| 5,036,209 | 7/1991 | Kataoka et al. | 250/492.2 |
| 5,051,556 | 9/1991 | Sakamoto et al. | 219/121.25 |
| 5,557,314 | 9/1996 | Okamoto et al. | 347/230 |

FOREIGN PATENT DOCUMENTS

62-260322 11/1987 Japan.

OTHER PUBLICATIONS

Semiconductor World, Jul. 1990, pp. 170–175, Jun. 20, 1989 by Press Journal Co., Ltd.

SPIE vol. 632 Electron–Beam, X–Ray, & Ion–Beam Technique For Submicrometer Lithographies V (1986) pp. 85–92.

Hitachi Review vol. 40 (1991), No. 6, Development and Application of Electron Beam Lithography Systems.

*Primary Examiner*—Benjamin R. Fuller
*Assistant Examiner*—L. Anderson
*Attorney, Agent, or Firm*—Antonelli, Terry, Stout, & Kraus, LLP

[57] ABSTRACT

Selective pattern exposure with high reliability is made possible by a desired pattern of repeated pattern and a non-repeated pattern. Exposure technology is obtained to enable improvement of preparation efficiency of pattern data and to secure inspection of an aperture pattern. With the invention, an electron beam is used as focused beam, and a pattern exposure apparatus of a batch transfer system for transferring repeated pattern and non-repeated pattern of plural graphics of a semiconductor integrated circuit or the like comprises an EB drawing section for controlling the beam and irradiating beam onto a sample, a control I/O section, a drawing control section and a data storage section. In the EB drawing section, a semiconductor wafer is mounted on a platform, and in the path of the electron beam from the electron beam source to the stage, a first mask, a blanking electrode, an electron lens, a first deflector, a second deflector, a second mask and a third deflector are installed.

43 Claims, 16 Drawing Sheets

X SCAN   $\ell_X$

Y SCAN   $\ell_Y$

MAGNIFICATION ERROR $M = \sqrt{\ell_X^2 + \ell_Y^2}/\sqrt{2}\cdot\ell - 1$ ...... (1)

ANGLE ERROR $\Theta = \arccos(\ell_X/\sqrt{\ell_X^2 + \ell_Y^2}) - \pi/4$ ...... (2)

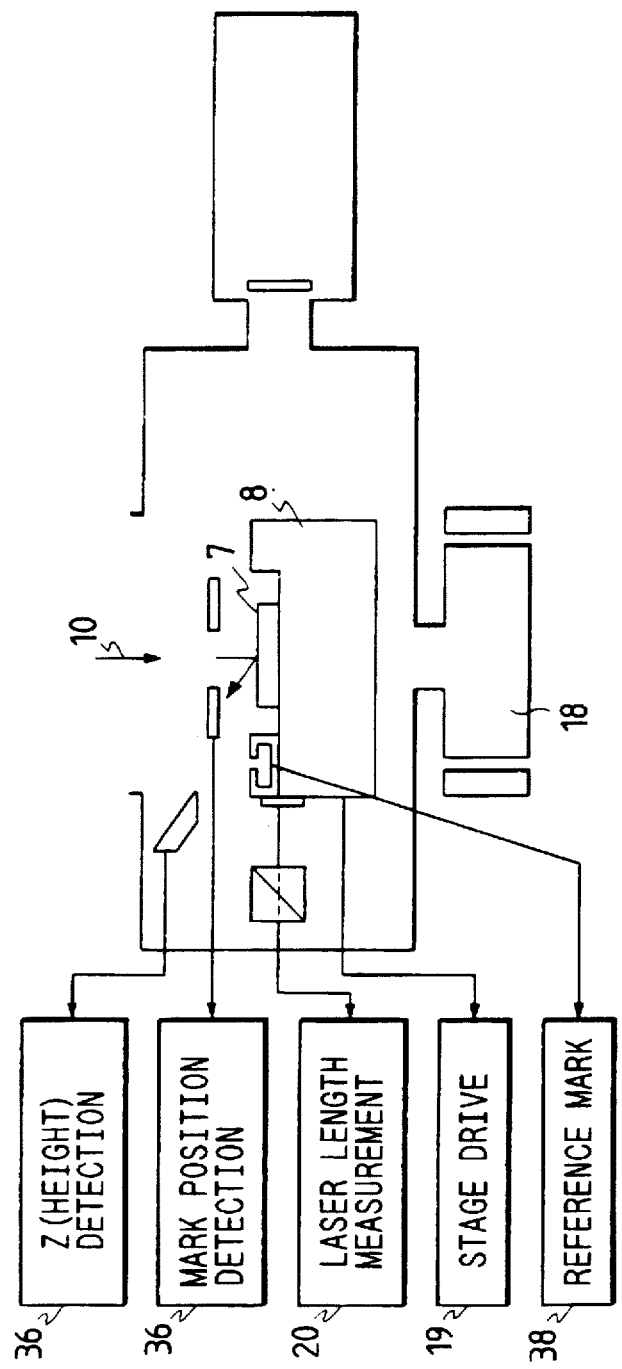

(FOR MOVING MARK
DETECTION SYSTEM)

(FOR ARRAY MARK
DETECTION SYSTEM)

ELECTRON BEAM IRRADIATION
QUANTITY (RELATIVE VALUE)
IN A-A POSITION

3-LAYER REPEATED ARRANGEMENT

FIG. 13

SSF COMMAND

| 0 0 1 1 | Pnt. NO | m |
|---|---|---|
| | PA | dPA |
| | x0 | |
| | y0 | |
| | dr0 | |

ONE-DIMENSIONAL ARRANGEMENT OF SSF IS ASSIGNED.
MEANING OF PARAMETERS IS AS FOLLOWS.

Pnt. NO ······ POINTER NUMBER OF STORAGE ADDRESS TABLE OF PATTERN DATA m ······ SSF REPEATED NUMBER OF ONE-DIMENSIONAL ARRANGEMENT

PA ······ RELATIVE POSITION OF POINTER OF TOP AND SSF dPA ······ REPEATED INCREMENT OF RELATIVE POSITION OF SSF POINTER x0, y0 ······ POSITION COORDINATES OF TOP AND SSF
(RELATIVE ASSIGNMENT FROM CHIP CENTER)

dr0 ······ REPEATED INCREMENT OF SSF POSITION COORDINATES

GRAPHIC DATA COMMAND 1    FIG. 14

1 GRAPHIC ASSIGNMENT BY VARIABLE RECTANGULAR BEAM (0) VARIABLE RECTANGULAR BEAM ASSIGNMENT

```
15    1312   9          0(bit)
| 1 1 1 | 1 0 1 0 |    Na=0    |
```

Na IS SELECTION NUMBER OF GRAPHIC APERTURE OF 2ND MASK (Na=0 IN VARIABLE RECTANGULAR BEAM)

(1) w DIMENSION ASSIGNMENT

```
15    1312              0(bit)
| 0 0 1 |    w(0~8191)    |
``` w INDICATES WIDTH OF GRAPHIC IN x-AXIS DIRECTION ($0 \leq w \leq 2^{13}-1$)

(2) h DIMENSION ASSIGNMENT

```
15    1312              0(bit)
| 0 1 0 |    h(0~8191)    |
``` h INDICATES WIDTH OF GRAPHIC IN y-AXIS DIRECTION ($0 \leq h \leq 2^{13}-1$)

(3) x COORDINATES ASSIGNMENT

```
15    1312              0(bit)
| 0 1 1 |   x(-4096-4096)  |
``` x INDICATES RELATIVE x-COORDINATES OF GRAPHIC FROM SUBFIELD CENTER ($-2^{12} \leq x \leq 2^{12}-1$)

(4) y COORDINATES ASSIGNMENT

```
15    1312              0(bit)
| 1 0 1 |   y(-4096-4096)  |
``` y INDICATES RELATIVE y-COORDINATES OF GRAPHIC FROM SUBFIELD CENTER ($-2^{12} \leq y \leq 2^{12}-1$)

(5) GRAPHIC SORT N ASSIGNMENT

```
15           9 8 7 6       0(bit)
| 0 0 0      1 0| 0 | (GRAPHIC SORT N) |
```

N INDICATES NUMBER OF PATTERN GRAPHIC CLASSIFIED BY SHAPE SUCH AS RECTANGLE PARALLELOGRAM etc (6) EXPOSURE TIME T ASSIGNMENT

```
15              9 8 7 6    0(bit)
| 0 0 0 0 0 1 0 0 |  T (TIME)  |
```

T INDICATES PARAMETER CORRESPONDING TO IRRADIATION TIME OF BEAM. CONVERSION TO ACTUAL EXPOSURE TIME IS CARRIED OUT REFERRING TO TIME CONVERSION TABLE SEPARATELY

FIG. 15

GRAPHIC DATA COMMAND 2

2 GRAPHIC ASSIGNMENT BY BATCH TRANSFER BEAM (0) BATCH TRANSFER BEAM ASSIGNMENT

| 15 1312 | 9 0(bit) |
|---|---|
| 1 1 1 1 0 1 0 | Na=0 |

Na IS SELECTION NUMBER OF GRAPHIC APERTURE OF 2ND MASK (3) x COORDINATES ASSIGNMENT

| 15 1312 | 0(bit) |
|---|---|
| 0 1 1 | x(-4096-4096) | x INDICATES RELATIVE x-COORDINATES OF GRAPHIC FROM SUBFIELD CENTER ($-2^{12} \leq x \leq 2^{12}-1$)

(4) y COORDINATES ASSIGNMENT

| 15 1312 | 0(bit) |
|---|---|
| 1 0 1 | y(-4096-4096) | y INDICATES RELATIVE y-COORDINATES OF GRAPHIC FROM SUBFIELD CENTER ($-2^{12} \leq y \leq 2^{12}-1$)

(6) EXPOSURE TIME T ASSIGNMENT

| 15 9 8 7 | 0(bit) |
|---|---|
| 0 0 0 0 0 1 0 0 | T(TIME) |

T INDICATES PARAMETER CORRESPONDING TO IRRADIATION TIME OF BEAM. CONVERSION TO ACTUAL EXPOSURE TIME IS CARRIED OUT REFERRING TO TIME CONVERSION TABLE SEPARATELY

EXPOSURE METHOD AND PATTERN DATA PREPARATION SYSTEM THEREFOR, PATTERN DATA PREPARATION METHOD AND MASK AS WELL AS EXPOSURE APPARATUS

This is a Continuation application of U.S. Ser. No. 08/077,411, filed Jun. 16, 1993, now U.S. Pat. No. 5,557,314, issued Sep. 17, 1996.

BACKGROUND OF THE INVENTION

The present invention relates to an exposure method and its pattern preparation technology, and particularly relates to an effective technology to be applied to an exposure method and pattern data preparation system used therefor, pattern data preparation method and a mask as well as an exposure apparatus, where in exposure of integrated circuit patterns of a semiconductor integrated circuit device, periodic and repeated patterns can be exposed at high speed and high precision by irradiation of a focused beam of electron rays or the like.

For example, in a manufacturing process of a semiconductor integrated circuit device, various types of fine processing technology using focused beams have been put to practical use, such that an integrated circuit pattern is drawn to a photo mask (reticle) or a semiconductor wafer using an electron beam or a laser beam, and a defective portion of an integrated circuit pattern is corrected using a focused ion beam.

Among the focused beam processing technologies, the use of electron beams to irradiate a wafer coated with an electron ray sensitive resist thereon and an integrated circuit pattern exposed directly onto the wafer have become widely used in recent years, in comparison with conventional light exposure technology having an integrated circuit pattern formed on a photo mask which is transferred to a wafer, because a fine integrated circuit pattern can be formed on the former.

In the focused beam processing technology, a focused beam is computer-controlled based on design data of an integrated circuit, and the beam and a sample are positioned exactly, thereby fine processing with high precision is realized.

Also in the method using focused beams, in general, since a pattern is formed by a quite finely focused beam there is a problem. In order to improve the throughput significantly, a method is disclosed, for example, in JPA No. 260322/1987, where a graphic unit having repeated graphics is formed with an aperture of graphic form (hereinafter referred to as "mask") formed at a prescribed position in a column through which an electron beam for example is transmitted, thereby the electron beam is shaped in the mask is irradiated repeatedly.

That is, a beam of a relatively large diameter is selectively transmitted through an aperture of a mask in a small domain on the mask and the mask is beam-shaped, and this is transferred onto the resist by irradiation. The optical system of the electron beam apparatus in the above-mentioned system is disclosed in U.S. Pat. No. 4,213,053.

An explanation of this system is disclosed in a reference such as "Semiconductor World, Jul. 1990" pp. 170–175, published on Jun. 20, 1989 by Press Journal Co., Ltd.

Further, an FIB (Focused Ion Beam) apparatus is used as an apparatus having a narrowed ion beam irradiated on a semiconductor wafer to perform a process treatment of the semiconductor wafer. Regarding the FIB apparatus, a control file and control method are described in SPIE vol. 632 Electron-Beam, X-Ray, & Ion-Beam Technique For Submicrometer Lithographies V(1986) pp. 85–92 for example.

BRIEF SUMMARY OF THE INVENTION

However, the beam transfer technology using a mask with a graphic aperture as above-described has been proposed as effective means to improve the throughput. It has been found by the present invention that in order to implement the beam transfer technology, the following problems exist which if the problems are not solved, the throughput cannot be improved.

For example, when the method of transferring the mask pattern using the focused beam is applied to a semiconductor integrated circuit device, a mask composed of plural graphic apertures must be prepared. That is, the transfer pattern is different in each process to form the semiconductor integrated circuit, and further it is different in each part of the circuit construction.

Also in the beam transfer technology using the mask with a graphic aperture, it is assumed that a mask composed of plural graphic apertures is prepared. In a peripheral circuit portion or the like of the semiconductor circuit device, however, there are many patterns which cannot be formed by the mask of graphic apertures. Since use of the mask of the graphic apertures is different in the pattern of the peripheral circuit portion, for example, a system may use variable shaping of the beam in the prior art for the peripheral part which is drawn separately.

Further, in these methods, when patterns including repetition of plural graphics such as a semiconductor integrated circuit are subjected to the beam transfer using the mask of the graphic aperture, in order to improve the throughput, essential problems exist in repeating a graphic minimum unit provided in the mask, exposure in a range of the repeated graphic and the non-repeated graphic and the like.

The minimum unit of the repeated graphic provided in the mask, i.e., the arrangement number of the unit pattern is disclosed in Japanese patent application No. 66218/1991 by the present inventors. However, the pattern exposure method regarding a range of the repeated pattern and a non-repeated pattern in the graphic or range of different repeated patterns is not considered.

That is, if the pattern exposure range of the repeated pattern and the non-repeated pattern in the graphic or range of different repeated patterns is to be carried out in the prior art, the beam transfer using the mask of the graphic aperture is repeated on the sample every time the mask is different, and further the exposure is carried out using the variable shaping beam in the prior art. As a result, the beam transfer using the mask of the graphic aperture may be capable of being exposed with a high throughput, but cannot be widely used.

Therefore, it becomes a problem of how the exposure using the mask of the graphic aperture and the exposure using the variable shaping beam are combined. Further, a problem exists between the exposed pattern using the mask of the graphic aperture and the exposed pattern using the variable shaping beam with the precision of the exposure and the required time.

Also a problem exists in that the drawing pattern data by the mask of the graphic aperture and the drawing pattern data using the variable shaping beam are prepared with good matching and good efficiency, from the pattern data of a semiconductor integrated circuit or the like.

In the mask of the graphic aperture in the prior art, however, identification with a basic functional element pattern such as logic or memory to construct the semiconductor integrated circuit is generally different. That is, although the mask of the graphic aperture is restricted in its field by the maximum beam dimension or the like which can be formed by the drawing apparatus, such restriction cannot be applied to the cell pattern comprising the basic functional of elements to construct the semiconductor integrated circuit.

Consequently, in the prior art, a problem exists in that preparation of the pattern data to form the pattern including the mask of the graphic apertures becomes quite troublesome when it is applied to a semiconductor integrated circuit or the like.

Also when the transfer is carried out by selection from the mask of plural graphic apertures, since the mask pattern cannot be seen directly, a selection error of the graphic aperture mask may occur with high probability and the elimination of such error becomes an important problem.

Accordingly, an object of the present invention is to provide an exposure method and a pattern data preparation system used therefor, pattern data preparation method and a mask as well as an exposure apparatus, where a pattern transfer uses a focused beam shaped by a mask comprising plural graphic apertures, the mask of the plural graphic apertures is selected and irradiated, thereby a selective pattern exposure with high reliability becomes possible by a pattern using the repeated pattern and the non-repeated pattern.

Another object of the present invention is to provide a pattern data preparation system used for an exposure method and a pattern data preparation method with pattern data used for the exposure method being prepared efficiently.

A further object of the present invention is to provide a mask used for an exposure method and the preparation of pattern data, where an inspection of aperture pattern formed in the mask of plural graphic apertures can be carried out securely.

The foregoing and other objects and novel features of the present invention will become apparent from the description of the specification and the accompanying drawings.

An outline of the invention is briefly described as follows.

The first exposure method of the present invention is an exposure method of patterns including repetition of plural graphics of a semiconductor integrated circuit or the like, where a first mask having a rectangular aperture and a second mask having at least one rectangular aperture and plural graphic apertures are interposed in sequence in the path of the focused beam from the beam source to the sample such as a semiconductor wafer, and the deflection control of the focused beam is provided with a first deflection control means for carrying out the deflection control of the beam passing through the first mask and for selecting the rectangular aperture and a part of the plural graphic apertures of the second mask, the second deflection control means changes dimensions of the beam passing through the rectangular aperture, and a third deflection control means performs the deflection control of the transmitted beam of the second mask to a desired position on the sample.

In the second exposure method of the present invention, in addition to the first exposure method, a mounting stage of the sample can be moved within the deflection control range of the third deflection control means corresponding to the position on the sample.

Further, the third exposure method of the present invention is an exposure method of patterns including repetition of plural graphics, where the first mask having a rectangular aperture and the second mask having at least one rectangular aperture and plural graphic apertures are interposed in sequence in the path of the focused beam from the beam source to the sample, and the second mask has plural beam deflection fields and each of the plural beam deflection fields is provided with plural graphic apertures and a rectangular aperture, and the deflection control of the focused beam is provided with the first deflection control means for performing the deflection control of the beam passing through the first mask and for selecting the rectangular aperture and a part of the plural graphic apertures of the second mask, the second deflection control means changes dimensions of the beam passing through the rectangular aperture, and the third deflection control means performs the deflection control of the transmitted beam of the second mask to a desired position on the sample.

In this case, in the control data used for control of the first, second or third exposure methods, the repeated part of the graphic information corresponds to the graphic apertures and a part of the plural graphic apertures of the second mask is selected by the first deflection control means of the focused beam passing through the first mask, the name or identification code corresponding to the aperture pattern of the second mask and the position coordinate data corresponding to a position on the sample of the transfer pattern and the repeated data are made components of formed pattern data, and since the non-repeated part of remaining part of the extraction varies the beam dimension passing through the rectangular aperture of the second mask by the second deflection control means of the focused beam passing through the first mask, the beam dimension of the focused beam of the dimension data corresponding to this and the position coordinate data corresponding to a position on the sample are made components of formed pattern data.

Further, the pattern data preparation system used for the exposure method of the present invention is provided with input means and storage means of input data, and output means and storage means of control data, and input data are made a data file where pattern data or graphic information including repetition of information of plural graphics are specified and stored through a storage medium such as a magnetic tape or a communication apparatus coupled to a storage apparatus such as a magnetic disc, and control data are made a data file where pattern data which are a component of the repeated part of the graphic information and pattern data which are a component of the non-repeated part are synthesized and stored in a storage apparatus such as a magnetic disc connected to an input/output signal bus of a computer to control an exposure apparatus using the exposure method of the present invention.

In the first pattern data preparation method used for the exposure method of the present invention, when plural patterns such as semiconductor integrated circuit patterns are laminated to prepare pattern data, pattern data for a mask of graphic apertures are separated from plural patterns of the integrated circuit or the like.

Further in the second pattern data preparation method used for the exposure method of the present invention, the names or codes are provided for plural graphic apertures of the second mask corresponding to respective graphic apertures transferred at one time.

In the third pattern data preparation method used for the exposure method of the present invention, the relative position between pattern data for the plural graphic apertures of the second mask corresponding to respective graphic apertures transferred at one time and pattern data formed by the rectangular aperture of the second mask can be changed.

In a first mask used for the exposure method of the present invention, a second mask is constructed by at least one rectangular aperture and plural graphic apertures within the beam deflection field of the first deflection control means.

In a second mask used for the exposure method of the present invention, the second mask is constructed by one rectangular aperture and at least a part of graphic apertures of the repeated part of the semiconductor integrated circuit pattern being at nearly the deflection center within the beam deflection domain of the first deflection control means.

Further a third mask used for the exposure method of the present invention comprises a first mask and a second mask, and the first mask is constructed by plural rectangular apertures and larger rectangular apertures overlaid each other at the beam source side.

The first exposure apparatus of the present invention is an exposure apparatus of patterns using a focused beam such as electron beam, where the first mask having a rectangular aperture and the second mask having at least one rectangular aperture and plural graphic apertures are interposed in sequence in the path of the focused beam from the beam source to the sample such as a semiconductor wafer, and the deflection control of the focused beam is provided with the first deflection control means for providing the deflection control of the focused beam passing through the first mask and for selecting the rectangular aperture and a part of the plural graphic apertures of the second mask, the second deflection control means changing dimensions of the beam passing through the rectangular apertures of the second mask, and the third deflection control means providing the deflection control of the transmitted beam of the second mask to a desired position on the sample, and the pattern exposure controls the focused beam by repetition of the deflection control by the third deflection control means after the deflection control by the first deflection control means or repetition of the deflection control by the second deflection control means and the deflection control by the third deflection control means after the deflection control by the first deflection control means.

The second exposure apparatus of the present invention is an exposure method of patterns using a focused beam such as electron beam, where the first mask having a rectangular aperture and the second mask having at least one rectangular aperture and plural graphic apertures are interposed in sequence in the path of the focused beam from the beam source to the sample, and the deflection control of the focused beam is provided with the first deflection control means providing the deflection control of the focused beam passing through the first mask and for selecting the rectangular aperture or a part of the plural graphic apertures of the second mask, the second deflection control means changing dimensions of the beam passing through the rectangular aperture, and the third deflection control means providing the deflection control of the transmitted beam of the second mask to a desired position on the mask, and the pattern exposure controls the focused beam and irradiates the beam by repetition of the deflection control by the third deflection control means after the deflection control by the first deflection control means or repetition of the deflection control by the second deflection control means and the deflection control by the third deflection control means after the deflection control by the first deflection control means, while the mounting stage of the sample is moved and within the beam deflection control range of the third deflection control means corresponding to a position on the sample.

Further the third exposure apparatus of the present invention is an exposure apparatus of patterns using focused beam such as electron beam, where the first mask having a rectangular aperture and the second mask having at least one rectangular aperture and plural graphic apertures are interposed in sequence in the path of the focused beam from the beam source to the sample, and the second mask has plural beam deflection fields and each of the plural beam deflection fields is provided with plural graphic apertures and a rectangular aperture, and the moving control means of the second mask is provided, and the deflection control of the focused beam is provided with the first deflection control means of the focused beam passing through the first mask, and the third deflection control means provides the deflection control of the transmitted beam of the second mask to a desired position on the sample, and after the second mask is moved, the sample is moved to the reference mark position on the sample or the sample bed, and a reference of the beam deflection control position of the first deflection control means and the third deflection control means is calibrated and the sample is moved to the desired position and the focused beam is irradiated.

According to the first exposure method and the exposure apparatus as above-described, since the first deflection control means, the second deflection control means and the third deflection control means are provided as the deflection control of the focused beam in the path of the focused beam in which the first mask and the second mask are interposed, at least a part of the repeated pattern of graphics selects a part of the plural graphic apertures of the second mask using the first deflection control means and then irradiation of the focused beam to a desired position on the sample is repeated using the third deflection control means, and the non-repeated pattern selects the rectangular aperture of the second mask using the first deflection control means and then dimensions of the beam passing through the rectangular aperture of the second mask are changed using the second deflection control means and the focused beam is irradiated to a desired position on the sample using the third deflection control means thereby the resultant pattern can be formed.

According to the second exposure method and the exposure apparatus as above-described, while the mounting stage of the sample is moved, the resultant pattern can be formed on the sample within the deflection control range of the corresponding third deflection control means.

Further according to the third exposure method and the exposure apparatus as above-described, after the second mask is moved, the reference position of at least one of the first deflection control means or the second deflection control means and the third deflection control means is calibrated using the reference mark on the sample or on the sample bed and the sample is moved to a desired position and then the focused beam is irradiated thereby the resultant pattern can be formed.

That is, in the exposure methods and the exposure apparatuses as above-described, in the exposure of patterns including repetition of plural graphics of a semiconductor integrated circuit or the like using a focused beam such as electron beam, a part of plural graphic apertures of the second mask is selected by the deflection control of the focused beam passing through the first mask, thereby when the beam is irradiated to a desired position of the sample and the semiconductor integrated circuit pattern is formed on the sample, regarding the desired pattern part corresponding to the graphic aperture, since the name or code corresponding to a pattern of the graphic aperture of the second mask and the position coordinates are made components and pattern data can be prepared, a part of the plural graphic apertures of the second mask can be selected by the deflection control of the focused beam passing through the first mask.

On the other hand, regarding the desired pattern, except a pattern formed by the aperture position, since the beam dimension and the position coordinates are made components and pattern data can be prepared, the beam passing through the rectangular apertures of the first mask and the second mask is subjected to deflection control and the beam dimensions can be varied. The exposure of the desired pattern becomes possible by selection by the plural graphic apertures and variation of the beam dimensions.

In this case, the control data used for the exposure method are made pattern data for the repeated part of the graphic information to select a part of the plural graphic aperture of the second mask and also made pattern data for the non-repeated part to vary the beam dimensions passing through the rectangular aperture of the second mask, so that the pattern data of the repeated part and the pattern data of the non-repeated part are continued or classified and can be made the pattern data in synthesized output, in the beam deflection range unit of the third deflection control means or the dividing range unit.

The pointer table data for continuing, classifying, dividing and synthesizing are added, and can be made pattern data to indicate the memory address of each data pattern of the repeated part and the non-repeated part.

Further, corresponding to moving of the second mask, pattern data separated and outputted in the moving unit of the second mask can be formed so that the calibrated command of the irradiation beam position of the focused beam by the reference mark becomes possible.

Also according to the pattern data preparation system used for the exposure method as above-described, since the input means, the storage means of input data and the output means have a control, the input data can be stored through the storage medium such as a magnetic tape or the communication apparatus to the storage apparatus such as a magnetic disc, and the control data can be stored by the storage apparatus such as a magnetic disc connected to an input/output signal bus of a computer to control the exposure apparatus.

According to the first pattern data preparation method used for the exposure method as above-described, since the pattern data for the mask of the graphic pattern are separated from patterns of the integrated circuit or the like, an independent layer in a lamination structure having position coordinates of graphics overlaid thereon can be prepared. Thereby the preparation efficiency of the pattern data can be improved.

According to the second pattern data preparation method used for the exposure method as above-described, since the name or code is provided corresponding to the plural graphic apertures of the second mask, the input pattern data to the pattern drawing apparatus can include the name or code. During inputting to the pattern data drawing apparatus, the name or code of the mask pattern can be checked using the beam and the selection error of the mask pattern can be eliminated.

Further, according to the third pattern data preparation method used for the exposure method as above-described, the relative position between the pattern data corresponding to the plural graphic apertures of the second mask and the pattern data formed by the rectangular aperture of the second mask can be changed.

According to the first mask used for the exposure method as above-described, since the second mask is provided with at least one rectangular aperture and plural graphic apertures, a batch transfer beam with plural graphic apertures other than the above-mentioned plural graphic apertures and a variable rectangular beam can be formed by moving the second mask.

According to the second mask used for the exposure method as above-described, since the second mask is provided at nearly the deflection center within the first beam deflection range with one rectangular aperture and at least a part of the graphic apertures of the repeated part, when at least one type of pattern of the semiconductor integrated circuit by the exposure method is formed by moving the second mask, the batch transfer beam with necessary plural graphic apertures and the variable rectangular beam can be formed. Moreover the high speed control is carried out in comparison with the first deflection control, thereby the exposure at high speed can be carried out.

Further according to the third mask used for the exposure method as above-described, since the first mask is constructed by plural rectangular apertures and larger rectangular overlaid each other at the beam source side, the rectangular apertures of the first mask can be replaced and changed by moving the first mask.

BRIEF DESCRIPTION OF THE DRAWINGS

FIG. 5 is a detailed diagram showing a reference mark on a sample stage in the embodiment;

FIG. 13 is an explanation diagram showing arrangement of pattern data in the embodiment;

FIG. 14 is an explanation diagram showing constitution of pattern data in the embodiment;

FIG. 15 is an explanation diagram showing constitution of pattern data in the embodiment;

DETAILED DESCRIPTION OF THE INVENTION

Figure 1:
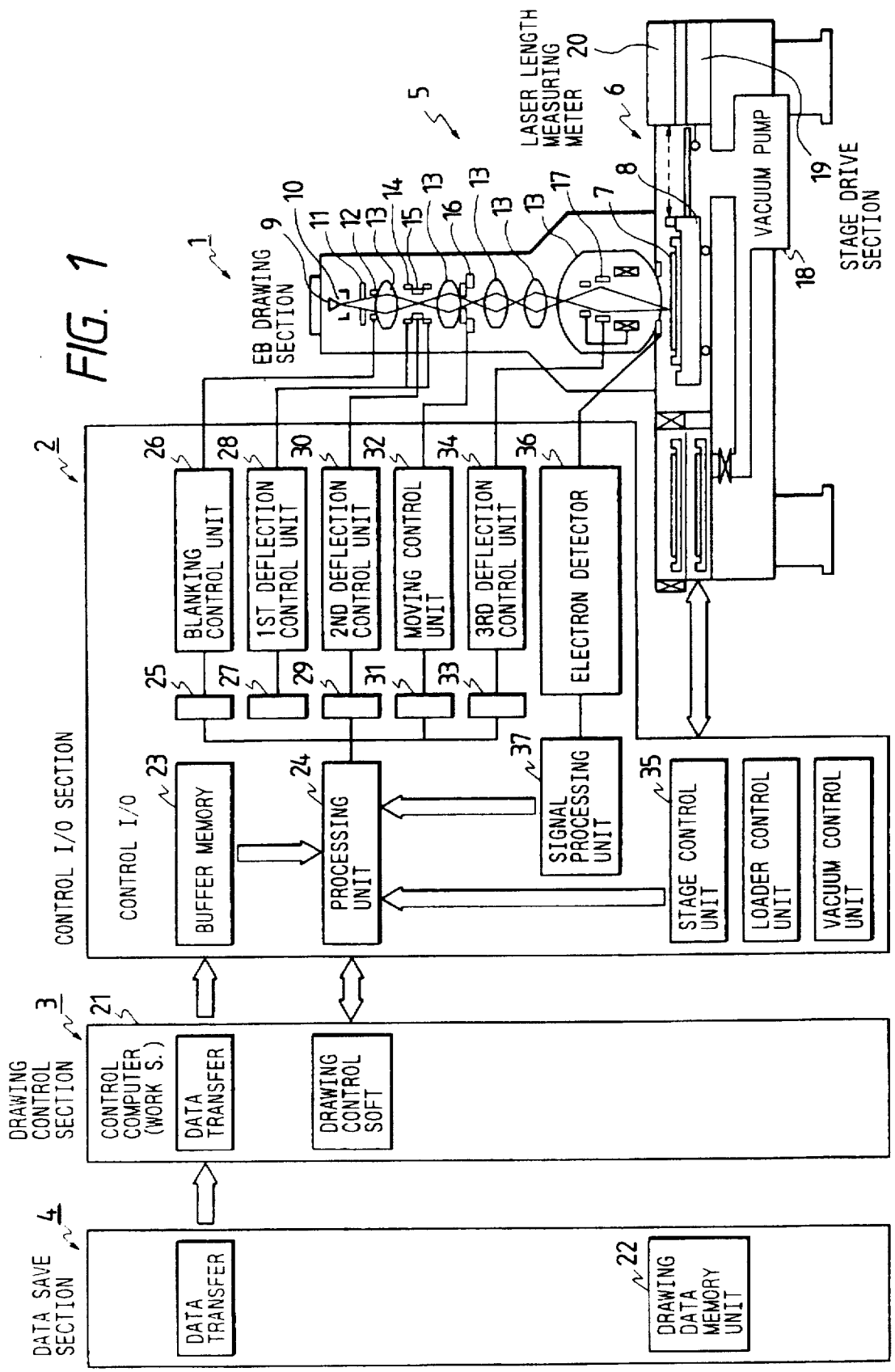
FIG. 1 is a block constitution diagram showing an exposure apparatus in a batch transfer system as an embodiment of the invention.
Figure 2:
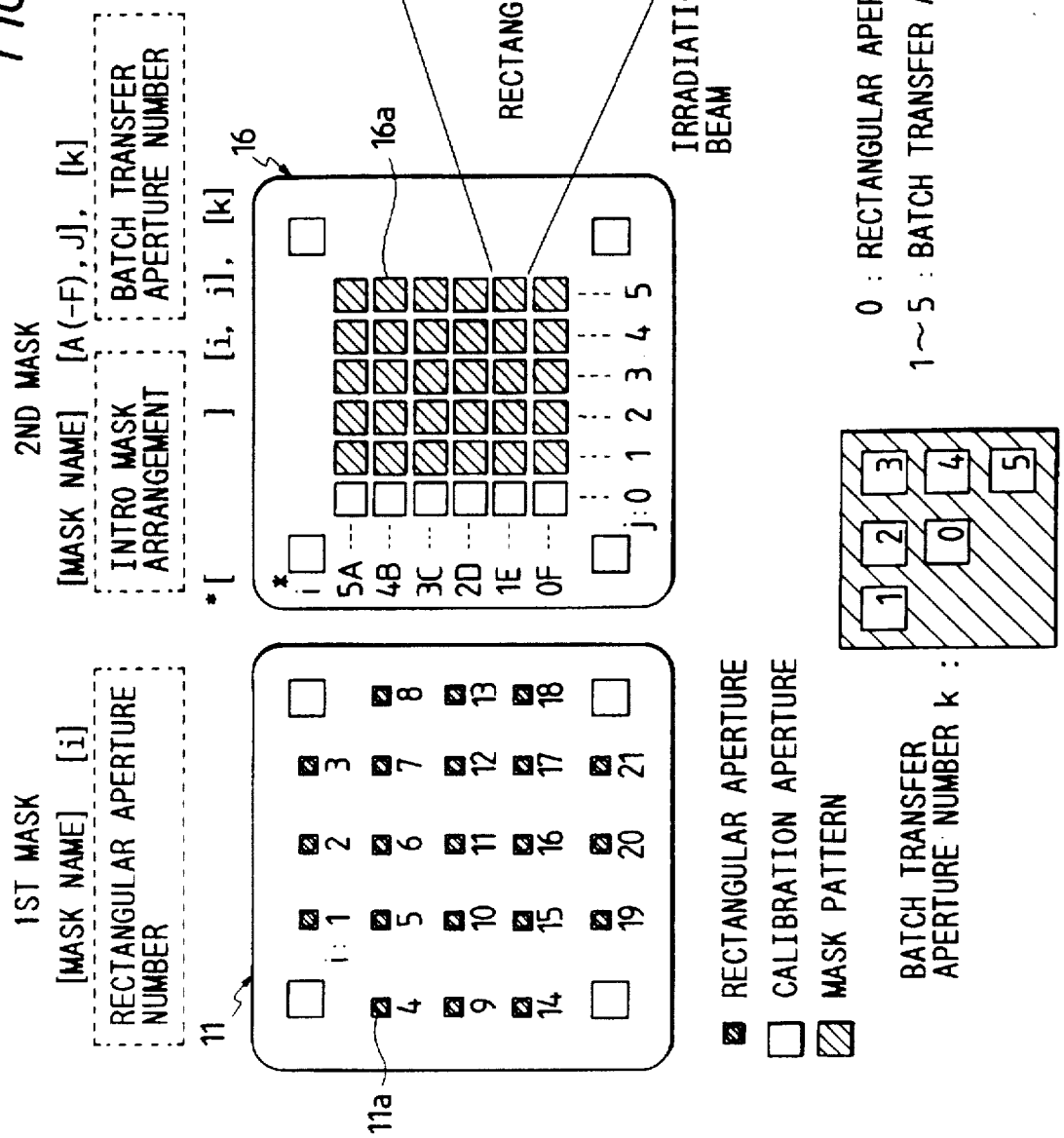
FIG. 2 is an explanation diagram showing constitution of a mask used for an exposure apparatus of the embodiment.
Figure 3:
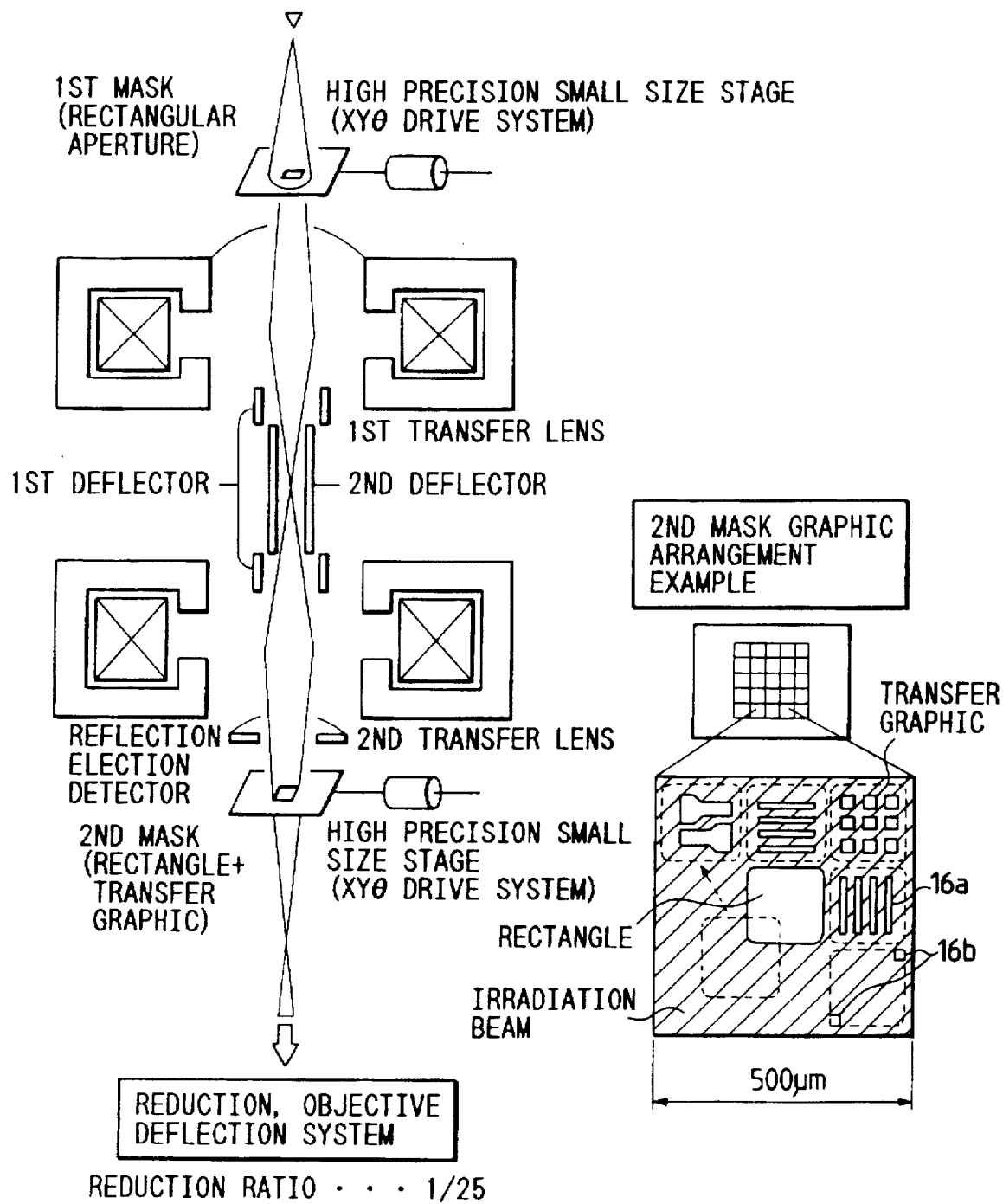
FIG. 3 is an explanation diagram taking and showing a main part of an exposure apparatus of the embodiment.
Figure 4:
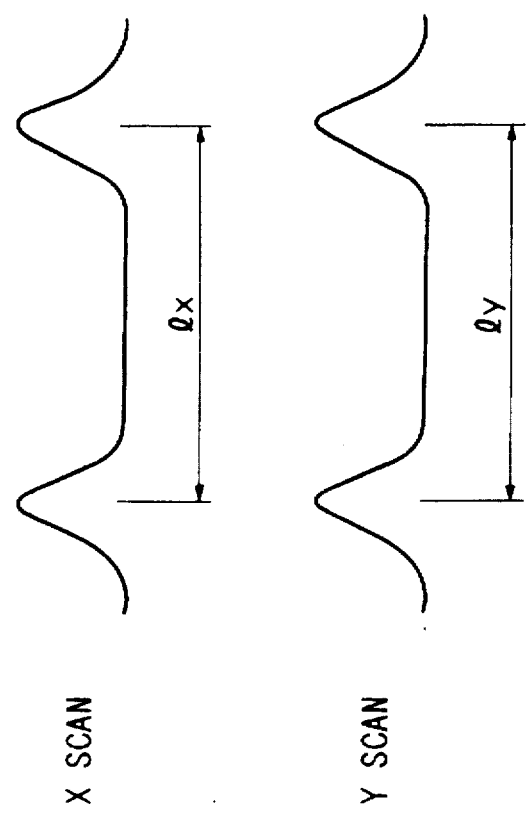
FIG. 4 is an explanation diagram showing calibration of an electron beam in the scanning direction in an exposure apparatus of the embodiment.
Figure 6A:
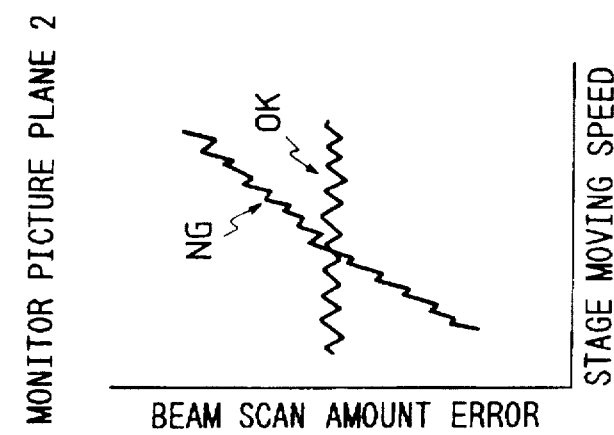
FIGS. 6(a) to 6(c) are explanation diagrams showing calibration of beam scan amount in the embodiment.
Figure 6B:
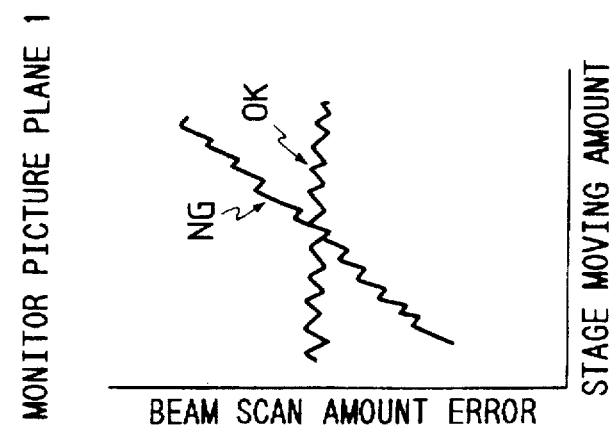
Figure 6C:
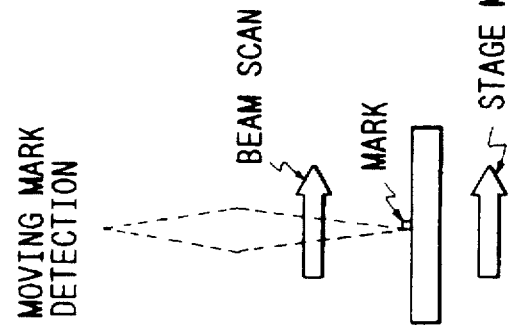
Figure 7A:
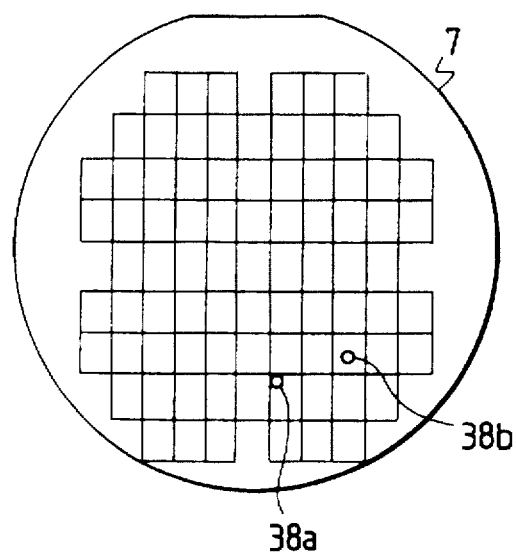
FIGS. 7(a) to 7(c) are explanation diagrams showing the case that a reference mark is provided on the sample in the embodiment.
Figure 7B:
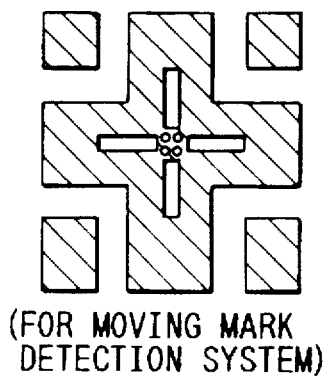
Figure 7C:
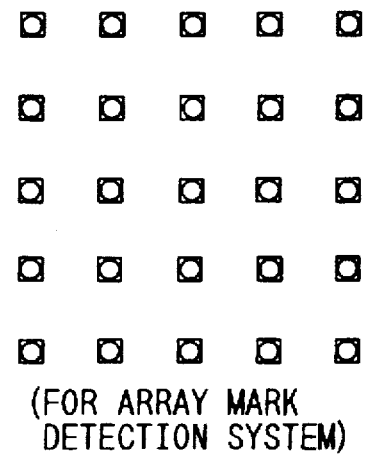
Figure 8A:
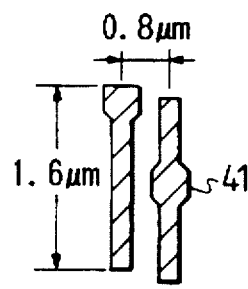
FIGS. 8(a) to 8(c) are explanation diagrams showing a repeated pattern and a batch transfer mark in the embodiment.
Figure 8B:
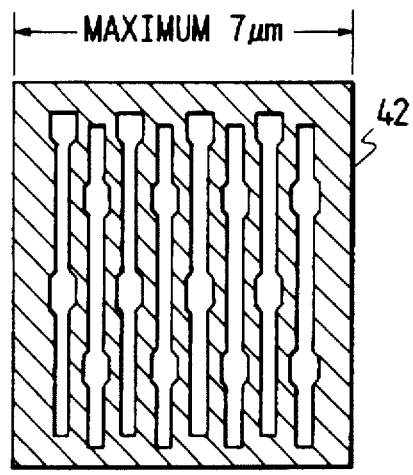
Figure 8C:
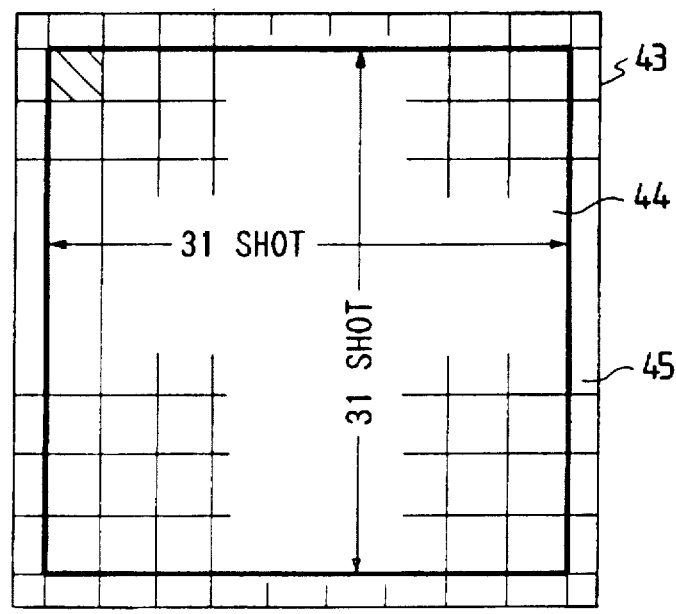
Figure 9A:
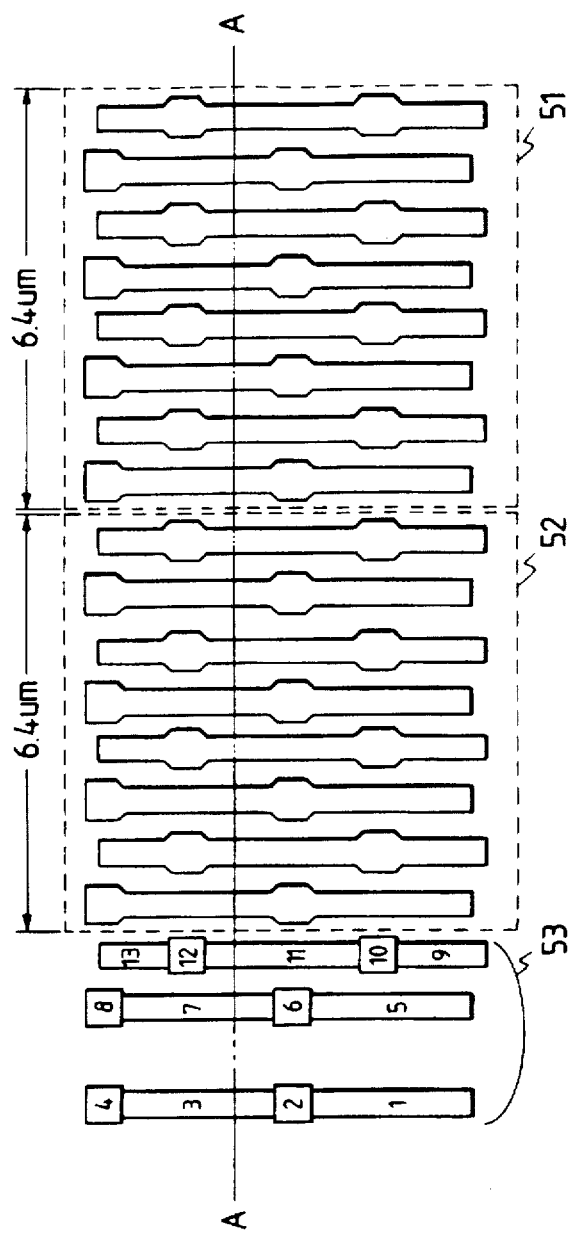
FIGS. 9(a) and 9(b) are explanation diagrams of exposure in a batch transfer beam and a variable rectangular beam in the embodiment.
Figure 9B:
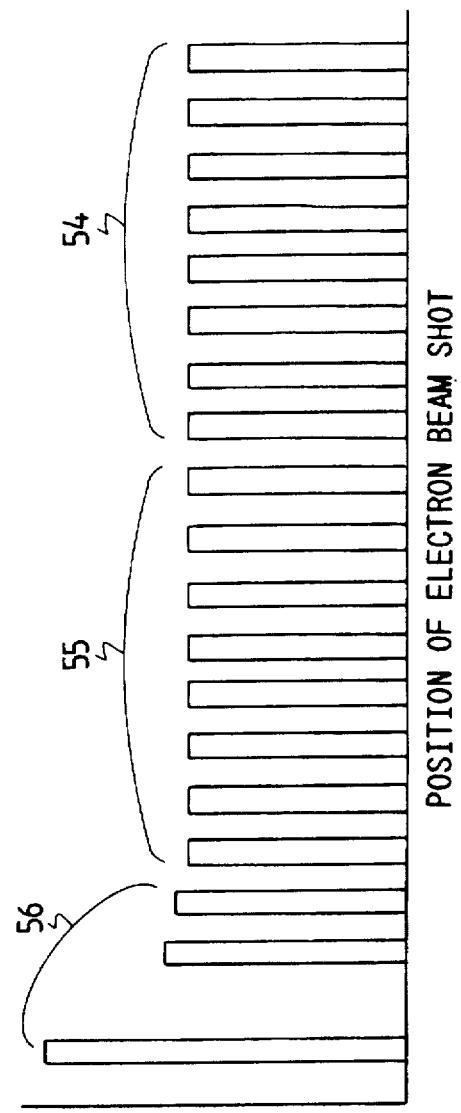
Figure 10:
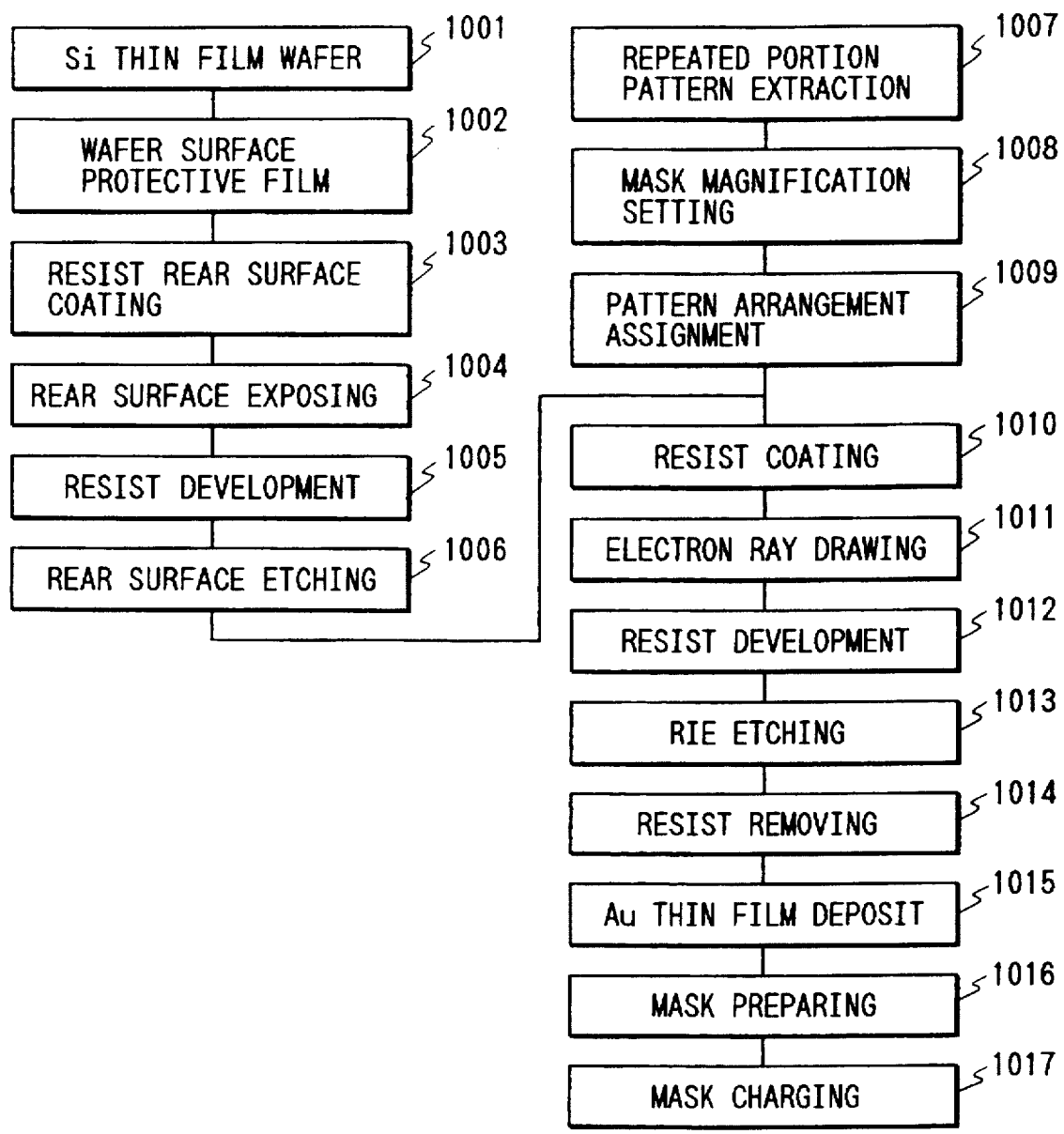
FIG. 10 is a flow chart of a mask in the embodiment.
Figure 11:
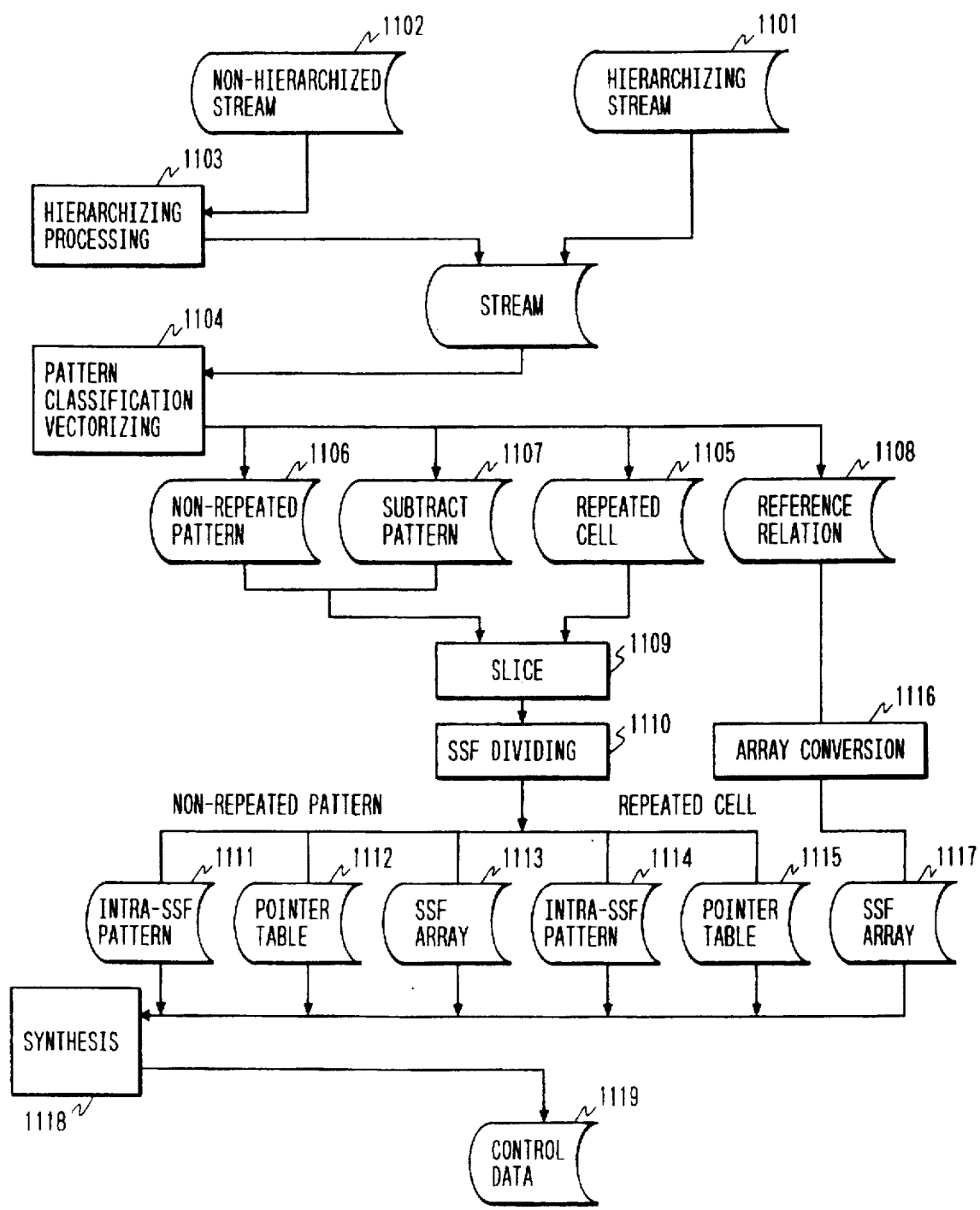
FIG. 11 is a flow chart of preparation of pattern data in the embodiment.
Figure 12:
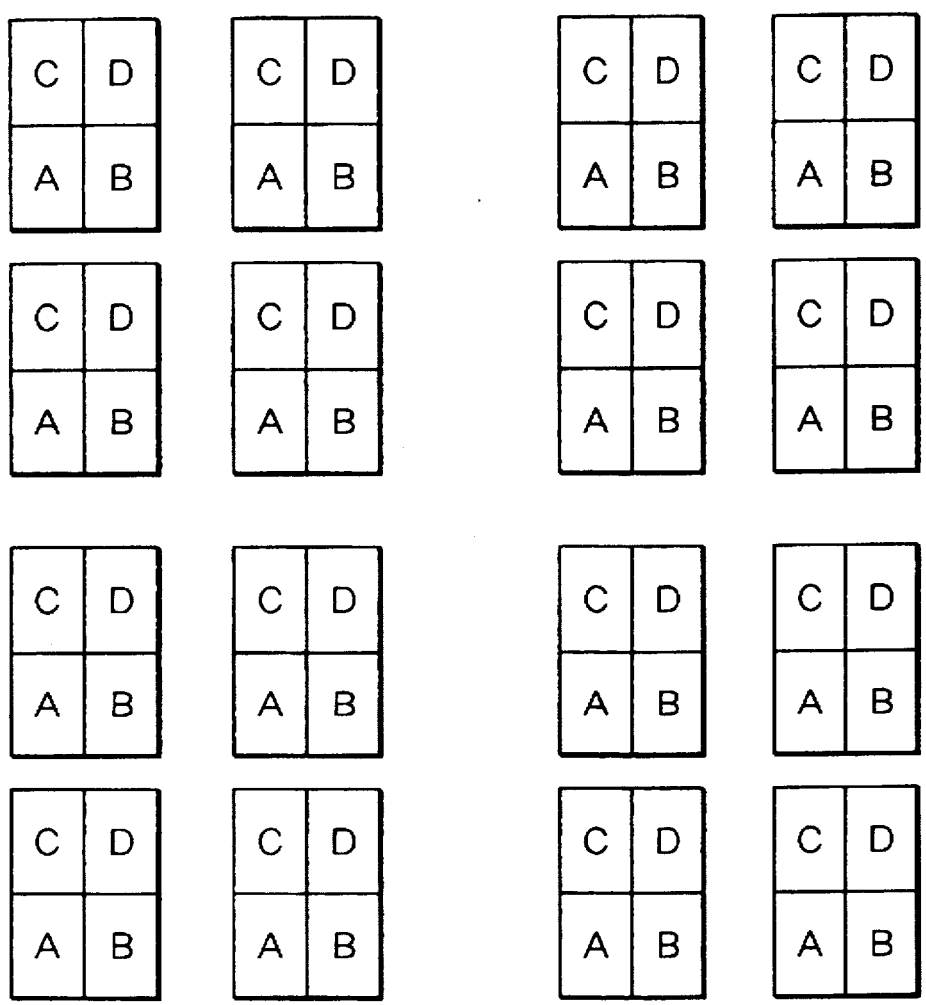
FIG. 12 is an explanation diagram showing constitution of arrangement data in the embodiment.
Figure 16:
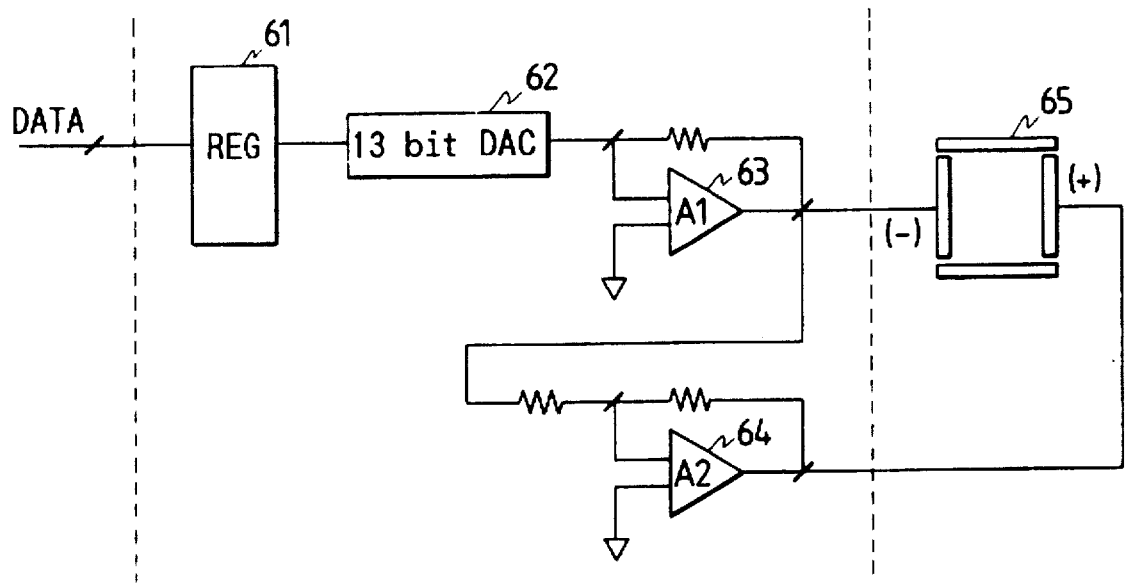
FIG. 16 is a constitution diagram showing a pattern data control circuit in the embodiment.
Figure 17:
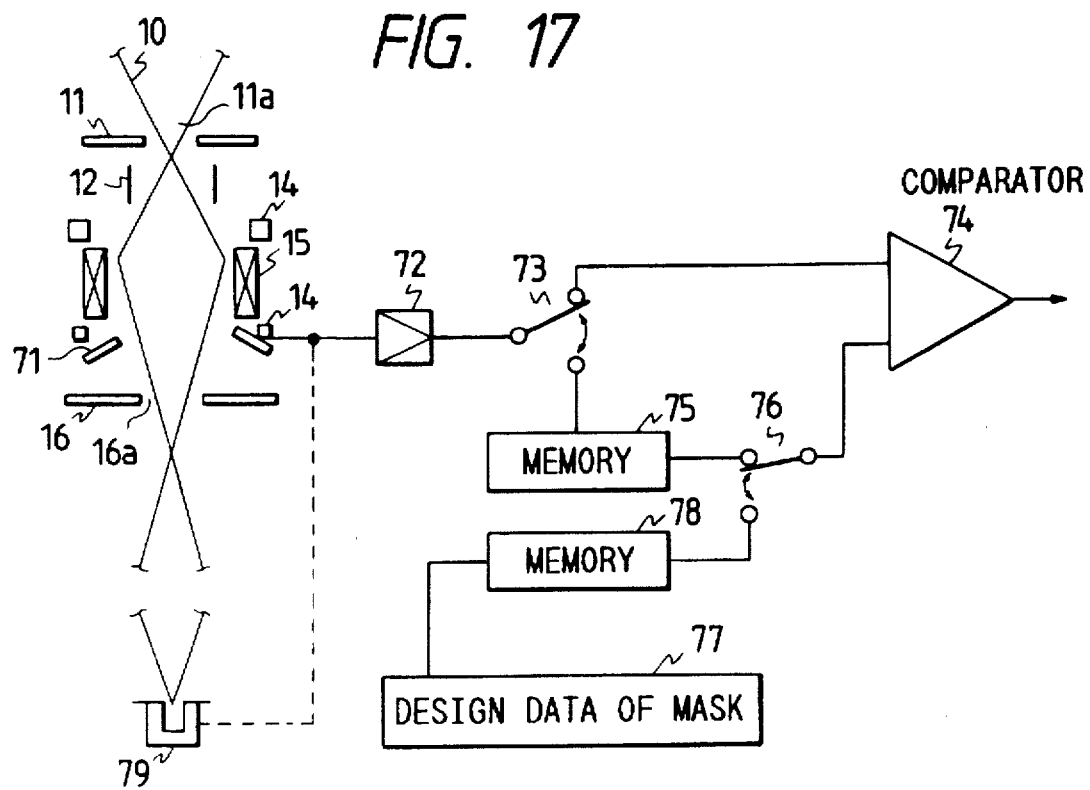
FIG. 17 is an explanation diagram showing inspection method of a mask in the embodiment.

FIG. 1 is a block diagram showing an exposure apparatus in a batch transfer system of an embodiment of the present invention; FIG. 2 is an explanatory diagram showing a construction of a mask used for an exposure apparatus of the embodiment; FIG. 3 is an explanatory diagram showing a main part of an exposure apparatus; FIG. 4 is an explanatory diagram showing calibration of electron beam in scanning direction; FIG. 5 is a detailed diagram showing a reference mark on a sample stage; FIGS. 6(a) to 6(c) are explanatory diagrams showing calibration of beam scan amount; FIGS. 7(a) to 7(c) are explanatory diagrams showing the case that reference mark is provided on the sample; FIGS. 8(a) to 8(c) are explanatory diagrams of repeated pattern and a batch transfer mask; FIGS. 9(a) and 9(b) are explanatory diagrams of exposure in batch transfer beam and variable rectangular beam; FIG. 10 is a flow chart of manufacturing of a mask; FIG. 11 is a flow chart of preparation of pattern data; FIG. 12 is an explanatory diagram showing arrangement data; FIG. 13 is an explanatory diagram showing pattern data; FIGS. 14 and 15 are explanatory diagrams showing pattern data; FIG. 16 is a diagram showing a pattern data control circuit; and FIG. 17 is an explanatory diagram showing inspection method of a mask.

First, construction of an exposure apparatus of the embodiment will be described referring to FIG. 1.

The exposure apparatus of the embodiment uses, for example, an electron beam as focused beam, and is made a pattern exposure apparatus in a batch transfer system for transferring repeated and non-repeated patterns of plural graphics of a semiconductor integrated circuit or the like. The exposure apparatus comprises an EB drawing section 1 for controlling and irradiating electron beam onto a sample, a control I/O section 2 for inputting and outputting control signals to the EB drawing section 1, a drawing control section 3 for controlling the whole apparatus, and a data storage section 4 for storing the drawing data.

The EB drawing section 1 comprises an electron beam optical system 5 and a sample stage system 6, and in the EB drawing section 1, a semiconductor wafer 7 as a sample mounted on a stage 8 comprising an XY stage movable in the horizontal plane. The surface of the semiconductor wafer 7 is coated, for example, by an electron sensitive beam resist.

The electron beam optical system 5 is provided at upper side of the stage 8 with plural electron lens groups and a control electrode for controlling and irradiating an electron beam source 9 and an electron beam 10, so that the electron beam 10 is emitted towards the semiconductor wafer 7.

In the path of the electron beam 10 from the electron beam source 9 to the stage 8 the electron beam optical system 5 is located, which comprises a first mask 11 with, for example, a rectangular aperture formed thereon, a blanking electrode 12 for controlling selective emission of the electron beam 10, an electron lens 13 for carrying out focusing of the electron beam 10, rotation correction of the electron beam 10 around the optical axis, reducing of the sectional shape of the electron beam 10, focusing of the electron beam 10 to the semiconductor wafer 7 and the like, a first deflector 14, a second deflector 15, a second mask 16 with plural graphic apertures formed thereon, and a third deflector 17 for controlling the irradiation position of the electron beam 10 in the semiconductor wafer 7.

The sample stage 6 is constructed within a vacuum chamber having a vacuum pump 18, so that the stage 8 on which the semiconductor wafer 7 is mounted is movable in the XY directions within the horizontal plane by a stage drive section 19. The position of the stage 8 in both XY directions is measured by laser interference measurement with a laser length measuring meter 20 and feed back to the electron beam optical system 5.

A control computer 21 is provided in the drawing control section 3 for controlling the whole apparatus, and a drawing data storage unit 22 of a large storage capacity with drawing data such as circuit pattern to be drawn on the semiconductor wafer 7 stored therein is provided in the data storage section 4. Drawing data necessary for the actual drawing operation are transferred to a buffer memory 23 of the control I/O section 2 and used for control of the electron beam optical system 5 by a processing unit 24.

In the processing unit 24 of the control I/O section 2, drawing data from the buffer memory 23 and mark position signal, height detection (designated by "Z detection") signal data and stage position data and the like, direct control signal data such as blanking for ON/OFF controlling the electron beam 10, first deflection for selecting a part of plural graphic apertures of the second mask 16, a second deflection for carrying out irradiation of a part of rectangular aperture of the second mask 16 and for varying the sectional dimensions of the transmitted electron beam 10, and a third deflection for determining the second mask control moving the second mask 16 and the irradiation field and the irradiation position of the electron beam 10 to the semiconductor wafer 7 are prepared.

That is, when the electron beam 10 is turned on or off, irradiation parameter data of the electron beam 10 are output from the processing unit 24, and the blanking electrode 12 is controlled through a blanking signal generator 25 and a blanking control unit 26.

When a part of plural graphic apertures of the second mask 16 is selected, graphic selection parameter data are output from the processing unit 24, and the first deflector 14 is controlled through a first deflection control signal generator 27 and a first deflection control unit 28. The first deflection control signal generator 27, the first deflection control unit 28 and the first deflector 14 comprise the first deflection control of the present invention.

Similarly, variation of the sectional dimensions of the electron beam 10 is carried out by the dimension parameter data of the electron beam 10 being outputted, and the second deflector 15 is controlled through a second deflection control signal generator 29 and a second deflection control unit 30, and irradiation is carried out in a partial cutaway of a part of a rectangular aperture of the second mask 16 and the dimensions of the transmitted electron beam 10 are varied. The second deflection control signal generator 29, the second deflection control unit 30 and the second deflector 15 comprise the second deflection control of the present invention.

Moving of the second mask 16 is carried out with moving control parameter data of the second mask 16 being output from the processing unit 24, and the second mask 16 is moved by a moving control signal generator 31 and a moving control unit 32, so that plural graphic apertures and one of the rectangular apertures enter in the deflection field of the electron beam 10.

Further, the third deflector 17 takes out parameter data of the irradiation domain and the control of an irradiation position of the electron beam 10 relation the semiconductor wafer 7 is outputted from the processing unit 24, and an operation of determining the irradiation position of the electron beam 10 on the semiconductor wafer 7 is carried out. The third deflection control signal generator 33, the third deflection control unit 34 and the third deflector 17 comprise the third deflection control in the present invention.

The third deflector 17 performs electromagnetic deflection for large angle deflections and electrostatic deflection for small angle high speed deflection in two stages. The irradiation position of the electron beam 10 on the semiconductor wafer 7 is controlled so that the electromagnetic deflection for large angle deflections of about 5 mm square and the electrostatic deflection for two-stage high-speed deflections of about 500 µm and 80 µm are superposed, so that the deflection of the electron beam 10 at large angles and high speed can be realized.

The stage 8 supporting the semiconductor wafer 7 held thereon is controlled through a stage control unit 35 by the control computer 21. The stage control unit 35 carries out the operation of moving the stage 8 to a commanded position from the control computer 21 based on the measured value obtained from the laser length measuring meter 20 which measures the displacement of the stage 8 precisely.

An electron detector 36 is located in the vicinity of the upper side of the stage 8, and when the electron beam 10 is irradiated on a positioning mark (not shown) formed at a desired position on the semiconductor wafer 7, secondary electrons which are generated are detected in synchronization with the scanning of the electron beam 10 so that the position of the positioning mark is detected and the specified operation is carried out. Also a detector (not shown) of the electron beam 10 is mounted on the stage 8 thereby current values of the electron beam 10 are detected.

Based on the position data of the positioning mark, the drawing field on the semiconductor wafer 7 is subjected to coordinate transformation through a signal processing unit 37, so that the drawing field is transformed into a value in prescribed reference coordinate system and parameters of the drawing data of the processing unit 24 are added thereto and the resultant value is used to control the third deflector 17.

In the vicinity of the electron detector 36 a height detection is positioned (Z detection) meter (not shown). That is, the light beam is irradiated at a prescribed inclination angle with respect to the surface of the semiconductor wafer 7, and the optical path of the light beam reflected at the surface of the semiconductor wafer 7 is detected by a light position sensor or the like so that the height of the semiconductor wafer 7 at the irradiation position of the light beam can be measured precisely. The light source of the light beam, a projection lens and a light receiving lens have been omitted from FIG. 1 for convenience of drawing.

Height information of the irradiation position of the electron beam 10 in the semiconductor beam 10 in the semiconductor wafer 7 detected through the Z detection sensor is transformed by the signal processing unit 37 into a prescribed reference coordinate system and then sent to the processing unit 24. The positioning operation of the electron beam 10 relative to the semiconductor wafer 7 by the electron lens 13 is controlled with reference to the height information.

An example of the construction of a first mask 11 and a second mask 16 is described referring to FIG. 2.

The first mask 11 is formed so that aperture patterns 11a of plural rectangular apertures are arranged in lattice shape, and since a moving mechanism of the first mask 11 is provided in combination with the electron beam source 9 or apertures on the first mask 11, when one rectangular aperture of the first mask 11 has deteriorated, it can be replaced by another rectangular aperture in a state that the high vacuum is not released to the atmospheric pressure.

The deterioration of a rectangular aperture is caused by contamination due to the irradiation of the electron beam 10, and depending on the current value of the electron beam 10, the treatment is effective when operation for a long period of several months or more occurs.

The second mask 16 is formed with plural aperture patterns 16a having a size enclosed within a deflection range of the electron beam 10 by the first deflector 14 positioned between the first mask 11 and the second mask 16. Individual aperture patterns 16a include, for example, batch transfer aperture patterns (number 1–5) and a rectangular aperture (number 0) of independent plural types of graphic apertures which become a mask pattern which individual patterns may have side dimensions "a" equal to 5000 µm. The batch transfer aperture patterns (number 1–5) are constructed with plural transfer graphic apertures, and correspond, for example, to repeated patterns of information of plural graphics of a semiconductor integrated circuit or the like.

Next, referring to FIG. 3, a main part of an exposure apparatus and a moving mechanism of the first mask 11 and the second mask 16 are described in detail.

As shown in FIG. 3, a first deflector 14 for selecting a part of plural graphics of the first mask 11 having a moving mechanism such as a high-precision small-size stage by $XY\theta$ drive system and the second mask 16 also having a moving mechanism, a second deflector 15 for varying dimension of the transmitted electron beam 10 and the like are provided. In addition, in moving the first mask 11, a mechanism for automatic moving control need not be always installed.

In a part of batch transfer aperture patterns (number 1–5) formed in the second mask 16, for example, a part of isolation patterns 16b selectable simultaneously by the electron beam 10 passing through the first mask 11 are formed on both corners in the diagonal direction as shown in a mask graphic arrangement example of FIG. 3. In each batch transfer of batch transfer aperture patterns (number 1–5) to the semiconductor wafer 7, these isolation patterns 16b are suitably used so that any position deviation of the second mask 16 can be corrected which individual patterns may have side dimensions of "a" equal to 500 µm.

For example, as shown in FIG. 4, distances $1_x$, $1_y$ are estimated from each peak position of detection signal waveforms in the X direction scan and the Y direction scan by the electron beam 10 passing through the isolation patterns 16b, and magnification error M and angle error $\theta$ of the batch transfer aperture patterns (number 1–5) can be estimated by equations (1) and (2).

That is, using two isolation patterns 16b selectable simultaneously by the electron beam 10, a relation between exciting current and magnification in an electron lens 13 of the electron beam optical system 5 on and after the second mask 16 and a relation between a rotation correction lens and rotational angle are previously measured so that the correction becomes possible. However, in the case of the isolation patterns 16b within the field selectable by the electron beam 10 at any one time, since the mutual distance is small, detection precision of position of the electron beam 10 must be raised.

Therefore in the case of the embodiment, as shown in FIG. 5, a Faraday cup part having knife edge installed on the stage 8 on which the semiconductor wafer 7 is mounted is scanned in both X-axis and Y-axis directions a plurality of times so that accurate detection of a position of the electron beam 10 is achieved. That is, while moving amount and moving speed with respect to a reference mark 38 on the stage 8 are measured by a laser length measuring meter 20, beam scanning is carried out, and as shown in FIG. 4, the beam scanning amount can be calibrated so that the beam scanning amount error becomes approximately constant on the monitor picture plane as can also be seen in FIGS. 6(a) to 6(c).

Also as shown in FIGS. 7(a) to 7(c), when the reference mark 38 is provided on the semiconductor wafer 7, the beam scan amount can be calibrated using the reference mark 38a of the moving mark detection system in (b), or in the reference mark 38b by the array mark detection system shown in (c), after the mark positions are measured by the laser length measuring meter 20, the beam scan is carried out again and the beam scan amount can be calibrated.

Further on both corners of the aperture patterns 16b, isolation patterns having a mutual distance larger than the isolation patterns 16b may be formed. In this case, since individual patterns cannot be selected at one time, deflection of the electron beam 10 to select both patterns individually and adjustment of return of the electron beam 10 after the selection are required causing the correction work to become slightly complicated.

As above-described, the second mask 16 becomes one feature of the embodiment, and the second mask 16 in combination with the first mask 11 is constructed by at least one rectangular aperture (number 0) and batch transfer aperture patterns (number 1–5) of plural transfer graphics within the first beam deflection domain. By moving the second mask 16, the batch transfer beam can be formed by plural graphic apertures other than the transfer graphics and the variable rectangular beam.

When the second mask 16 is moved using the moving control of the second mask 16, the electron beam 10 passing through the first mask 11 is subjected to deflection control by the first and second deflection controls, and the electron beam 10 transmitted through the second mask 16 is subjected to deflection control to a desired position on the semiconductor wafer 7 (third deflection control). Using the reference mark 38 on the semiconductor wafer 7 or the stage 8, the base of the first and third beam deflection control positions or the base of the second and third beam deflection control positions must be calibrated. Then the semiconductor wafer 7 is moved to the desired position and the electron beam 10 is turned on.

The batch transfer exposure method using the electron beam 10 is described as follows.

First, the desired aperture pattern 16a in the second mask 16 is positioned onto the optical axis of the electron beam optical system 5 by the moving mechanism of the second mask 16 as shown in FIG. 3.

Further, the electron beam 10 passing through the first mask 11 is deflected to the isolation pattern 16b formed on one of the batch transfer aperture patterns (number 1–5) included in the aperture pattern 16b of the second mask 16 by the second deflector 15, and passes through the isolation pattern 16b and is irradiated as the electron beam 10 of two lines to the side of the stage 8.

The Faraday cup or the like installed on the stage 8 is scanned, thereby any transfer error such as a rotation deviation around the optical axis of the isolation pattern 16b or a magnification error is measured and stored.

Then the electron beam 10 passing through the aperture pattern 11a of the first mask 11 is deflected to the batch transfer aperture patterns (number 1–5) of the aperture pattern 11a by the first deflector 14, and the cross sectional shape of the electron beam 10 is shaped.

The shaped electron beam 10 is controlled through the electron lens 13 and the third deflector 17, whose operation is corrected by the correction value obtained by the above-mentioned measurement, thereby irradiation is carried out to the desired position of the semiconductor wafer 7 held on the stage 8 being moved in XY direction, at desired amount into shape of the batch transfer aperture patterns (number 1–5) and the electron ray sensitive resist on the surface of the semiconductor wafer 7 is exposed to the light.

Next, the processing of drawing data in the exposure apparatus of the electron beam 10 of the embodiment is described.

First, the drawing data are stored in the drawing data storage memory unit 22 of the data save section 4 such as a magnetic disc. According to a command from the control computer 21, the drawing data of the desired pattern are transferred through the control computer 21 to the buffer memory 23, and the drawing position of the pattern of the semiconductor wafer 7 is positioned under the optical axis of the electron beam optical system 5.

The coordinate information or the height information of the desired drawing position within the plane of the semiconductor wafer 7 is transferred through the signal processing unit 37 to the buffer memory 23 by scanning the positioning mark on the wafer 7 by the electron beam 10.

Further based on the above-mentioned coordinate information, positioning of the desired irradiation position of the electron beam optical system 5 is carried out. Based on the height information of this field, the focal position of the electron lens 13 to the semiconductor wafer 7 is set.

Then the processing unit 24 calculates control signals relating to the shape of the electron beam 10, the deflection amount and the like based on the drawing data stored in the buffer memory 23, from the drawing data and the mark position signal from the buffer memory 23, the height detection signal data and the position data of the stage 8 and the like, the direct control signal data such as blanking for ON/OFF control of the electron beam 10, first deflection for selecting a part of the plural graphic apertures of the second mask 16, second deflection for irradiating a part of the rectangular aperture of the second mask 16 and for varying the sectional dimensions of the transmitted electron beam 10, second mask control for moving the second mask 16, and third deflection for determining the irradiation field and the irradiation position of the electron beam 10 to the semiconductor wafer 7 are prepared.

Next, an example of patterns including repetition of plural graphics of a semiconductor integrated circuit or the like will be described referring to FIGS. 8(a) to 8(c).

FIG. 8(a) shows repeated graphic units, and FIG. 8(b) shows a graphic becoming batch transfer apertures of the second mask 16. In FIG. 8(a) the spacing between patterns "b" is equal 6 to 0.8 μm and the height of each pattern "c" is equal to 1.6 μm and in FIG. 8(b) the side dimensions of the pattern "d" is a maximum of 7 μm. The aperture patterns 16a show wiring patterns 41 (4 bits) within the memory cell of the super high integration memory LSI, and are arranged regularly at an X-direction pitch of 0.8 μm and a Y-direction pitch of 1.6 μm.

If this is arranged within the maximum field where the uniform electron beam 10 can be obtained, 4×2 pieces are arranged and the batch transfer apertures 42 can be obtained. By the batch transfer apertures 42, one shot of the electron beam 10 corresponds to 32 bits.

FIG. 8(c) is an explanation diagram of constitution of a memory mat 43 of 32 kilobits, and repeated part 44 within the memory 43 carries out exposure of 31×31 shots in the batch transfer apertures 42 of (b). A peripheral part 45 of the memory mat 43 varies dimensions of the electron beam 10 and carries out exposure using the rectangular aperture (number 0) of FIG. 2.

Next, FIGS. 9(a) and 9(b) show exposure at link portion between the repeated pattern and the non-repeated pattern.

FIG. 9(a) shows an example of pattern formed by the batch transfer aperture beam 51, 52 and the variable shaping beam 53 (formed by the variable beam in 1–13). FIG. 9(b) shows an example of the irradiation quantity to expose the pattern in A—A position.

As shown in FIGS. 9(a) and 9(b), in the batch transfer aperture beam 51, 52, the irradiation quantity 54, 55 becomes constant within the shot. In FIG. 9(a) the transfer apertures beam 51,52 has side dimensions "e" equal to 6.4 μm. In a peripheral part the variable shaping beam 53, however, does not produce the optimum irradiation quantity due to the scattering phenomenon of the electron beam 10 called the proximity effect. Therefore in the exposure of the peripheral part, the irradiation quantity 56 of the electron beam 10 is enlarged depending on the area density of the exposure pattern. For example, when exposure is carried out on a sample on which wiring material such as tungsten is coated, such control of the irradiation quantity becomes necessary.

Therefore when the exposure apparatus of the electron beam 10 exposes a pattern including a repetition of plural graphics of a semiconductor integrated circuit or the like, exposure to link between the repeated pattern and the non-repeated pattern of the above-mentioned graphics or link between different repeated patterns is carried out by following exposure method.

In the case of exposure of patterns including repetition of plural graphics of a semiconductor integrated circuit or the like, the first mask 11 having the aperture pattern 11a of a rectangular pattern and the second mask 16 having at least one rectangular aperture (number 0) and the aperture patterns 16a of the batch transfer aperture patterns (number 1–5) of plural graphic apertures are interposed in sequence in the path of the electron beam 10 from the electron beam source 9 to the semiconductor wafer 7.

The deflection control of the electron beam 10 is carried out in that the electron beam 10 passing through the first mask 11 is subjected to deflection control by the first deflection control such as the first deflector 14. A part of the rectangular aperture (number 0) and the batch transfer aperture patterns (number 1–5) of the second mask 16 is selected. Dimensions of the electron beam 10 passing through the rectangular aperture (number 0) are changed by the second deflection control such as the second deflector 15, and the electron beam 10 transmitted through the second mask 16 is subjected to deflection control by the third deflection control including the third deflector 17 to a desired position on the semiconductor wafer 7.

A repeated pattern of graphics is formed in that a part of the plural batch transfer aperture patterns (number 1–5) of the second mask 16 is selected using the first deflection control, and then irradiation of the electron beam 10 to a desired position on the semiconductor wafer 7 is repeated using the third deflection control.

On the other hand, a non-repeated pattern of graphics is formed in that the rectangular aperture (number 0) of the second mask 16 is selected using the first deflection control, and then dimensions of the electron beam 10 passing through the rectangular aperture (number 0) of the second mask 16 are changed using the second deflection control and the electron beam 10 is irradiated to a desired position on the semiconductor wafer 7 using the third deflection control. The resultant pattern of the repeated pattern and the non-repeated pattern can thus be formed.

In the above-mentioned exposure, while the stage 8 of the semiconductor wafer 7 is moved, the resultant pattern can be formed on the semiconductor wafer 7 within the range of the corresponding third deflection control.

Further when the second mask 16 has plural beam deflection fields and each field is provided with plural batch transfer aperture patterns (numbers 1–5) and a rectangular aperture (number 0), after moving the second mask 16, the reference position of at least one of the first deflection control or the second deflection control and the third deflection control is calibrated using the reference mark on the semiconductor wafer 7 or the stage 8, and the semiconductor wafer 7 is moved to a desired position, and then the electron beam 10 is irradiated thereby the resultant pattern can thus be formed.

Thus is order to realize the above-mentioned pattern exposure method, pattern data for exposures corresponding to the method must be transferred to the drawing control section 3 of the exposure apparatus. In the exposure apparatus of the embodiment, the control I/O section 2 is provided with the buffer memory 23 of large capacity so as to control the electron beam 10 at high speed and carry out the ON/OFF irradiation. However, the data input/output time to the buffer memory 23 also becomes a problem.

Therefore when pattern data for exposure are stored in the storage apparatus, such as the magnetic disc of large capacity for temporary storage connected to a bus through a central processing unit (CPU) in place of the buffer memory 23, efficient transfer becomes possible by providing the data format.

In order to control the electron beam 10 at high speed by the first deflection control, the second deflection control, the beam blanking control and the like and to carry out the ON/OFF irradiation, drawing data to realize the above-mentioned pattern exposure is specified in the buffer memory 23 connected to these control circuits by a signal cable, or on the magnetic disc connected by a bus to these control circuits through the central processing unit (CPU).

Further in the above-mentioned exposure apparatus, when the stage 8 mounting the semiconductor wafer 7 is moved continuously and the pattern is exposed, the third deflection control combines electromagnetic deflection for large angle deflection and electrostatic deflection for small angle deflection operated in two stages as above-described. The electromagnetic deflection is corrected in response to the moving position of the stage 8 at the center position of the electrostatic deflection, thereby the pattern can be exposed while the stage 8 is moved continuously. In this case, the moving speed of the stage 8 must be corrected in response to the density of exposure pattern.

As above-described, the pattern exposure method of the embodiment is characterized in that during exposure of patterns including repetition of plural graphics of a semiconductor integrated circuit or the like, the first mask 11 having a rectangular aperture and the second mask 16 having at least one rectangular aperture and plural graphic apertures are interposed in sequence in the path of the electron beam 10 from the electron beam source 9 to the semiconductor wafer 7. The deflection control of the electron beam 10 becomes possible by the exposure apparatus comprising first deflection control for deflection control of the electron beam 10 passing through the first mask 11 and for selecting a rectangular aperture and a part of plural graphic apertures of the second mask 16, second deflection control for changing dimensions of the electron beam 10 passing through the rectangular aperture, and third deflection control for carrying out deflection control of the electron beam 10 passing through the second mask 16 to a desired position on the semiconductor wafer 7.

At least a part of repeated pattern of graphics is formed in that a part of plural graphic apertures of the second mask 16 is selected using first deflection control and then irradiation of the electron beam 10 to a desired position on the semiconductor wafer 7 is repeated using third deflection control, and a non-repeated pattern of graphics is formed with a rectangular aperture of the second mask 16 being selected using the first deflection control and then dimensions of the electron beam 10 passing through the rectangular aperture of the second mask 16 are changed using second deflection control and the electron beam 10 is irradiated to a desired position on the semiconductor wafer 7 using third deflection control thereby the resultant pattern can thus be formed.

Also the second feature is in that during the above-mentioned exposure, the resultant pattern can be formed on the semiconductor wafer 7 within the range of the corresponding third deflection control while the stage 8 of the semiconductor wafer 7 is moved.

Further, in the exposure apparatus where the second mask 16 has plural beam deflection fields and each field is provided with plural graphic apertures and a rectangular aperture, comprising first deflection control for carrying out deflection control of the electron beam 10 passing through the first mask 11 and for selecting a rectangular aperture and a part of plural graphic apertures of the second mask 16, a second deflection control for changing dimension of the electron beam 10 passing through the rectangular aperture, and third deflection control for carrying out deflection control of the electron beam 10 passing through the second mask 16 to a desired position on the semiconductor wafer 7, the third feature is in that after moving the second mask 16, the reference position of at least one of the first beam deflection control or the second beam deflection control and the third beam deflection control is calibrated using the reference mark on the semiconductor wafer 7 or the stage 8, and the semiconductor wafer 7 is moved to a desired position and then the electron beam 10 is irradiated thereby the resultant pattern is formed.

Next, use of the second mask 16 is described referring to FIG. 10.

In the second mask 16, an etching stopper layer and a single crystal layer with thickness of about 20 μm are laminated on a Si wafer to form a substrate, and the substrate is used with a prescribed magnification being set and apertures of repeated graphics and rectangular shape are formed.

The Si substrate is subjected to high density ion implantation of boron or the like, and this is made an etching stopper layer and epitaxial growth is carried out thereby Si thin film wafer can be manufactured (step 1001).

First, an oxide film or a nitride film is previously formed as a protective film onto the main surface of the Si wafer, and rear surface etching is carried out to the etching stopper layer. In this case, using a two-surface aligned exposure apparatus or the like, a resist coated on the rear surface of the Si wafer is exposed based on a registration mark formed on the wafer main surface. After the development, the rear surface of the substrate is subjected to alkaline anisotropy etching using potassium hydroxide or pyrocatechol (steps 1002–1006).

Subsequently, the Si wafer with the electron beam resist coated thereon is charged in the exposure apparatus of the electron beam 10 used in the embodiment. The drawing of patterns may be carried out using the exposure apparatus of the electron beam 10 in the embodiment or an apparatus in the prior art, but a format of graphics and arrangement of graphic apertures formed on the Si wafer must be used in the embodiment.

For example, magnification of patterns to be drawn on the Si wafer is 25 in the embodiment, and setting of the mask magnification after the repeated pattern extraction, pattern arrangement setting and the like are carried out before the resist coating (steps 1007–1009).

Further, the resist is coated and the mark at the base of the rear surface exposure is detected, positioning is carried out, the pattern is drawn, and then using the resist pattern as a mask, a groove of about 20 μm is formed on the main surface of the Si wafer substrate by the RIE etching. The oxide film on the Si wafer is etched, and using this as a mask, the Si wafer substrate is etched and the resist is removed (steps 1010–1014).

Regarding the field to be cut down on the mask peripheral part, the rear surface exposure and the main surface exposure are overlaid each other, thereby accuracy of the cut down dimension of the mask peripheral part can be improved.

The second mask 16 having apertures of repeated graphics and a rectangular shape with thickness of about 20 μm is formed from the Si wafer substrate. Then, a heavy metal such as Au, is deposited using a sputtering method or the like. A masking performance of the electron beam 10 due to light by the Si substrate only is improved (steps 1015–1017). The first mask 11 can be formed using the Si wafer substrate.

Next, pattern data preparation for controlling the exposure apparatus of the embodiment is described referring to FIG. 11.

Input data in this case are pattern data including repetition of plural graphics of a semiconductor integrated circuit or the like or data where information corresponding to these graphics is specified.

In the embodiment, in input data, a hierarchizing STREAM 1101 of stream format (Calma Stream Format) having repeated arrangement development information in a basic function element unit called cell is used.

This is because design of a semiconductor integrated circuit is carried out based on element design in cell units, and conversion processing of data, transfer processing and the like are facilitated by the repeated arrangement of development information. In addition to the exposure apparatus of the electron beam 10 used for the present invention, the data are generally used as input data for an electron beam exposure apparatus or a mask inspection apparatus in the prior art.

On the other hand, input data of non-hierarchized STREAM 1102, not having any repeated arrangement development information, assign repeated graphics and the pitch to extract the repeated graphics, and are converted into input data of hierarchical structure in hierarchizing processing of step 1103.

This is because, when pattern data including repetition of plural graphics are made into a stream format, it is preferable that pattern data comprising basic graphic, its repeated arrangement development information and non-repeated graphics are contained in one file as much as possible.

When data are distributed in plural files, the pattern data distributed in plural files for each drawing field during the pattern drawing must be retrieved and the data must be transferred to the drawing control section and be drawn, and therefore excessive drawing time is required. Also when patterns are synthesized on the semiconductor wafer 7, a working mistake such as assignment file mistake of pattern synthesizing are liable to occur.

Therefore, when pattern data to control the above-mentioned exposure apparatus are prepared, in pattern data formed in plural patterns such as semiconductor integrated circuit patterns are laminated, pattern data for mask of graphic aperture are separated from patterns of a semiconductor integrated circuit or the like and prepared in layers with the lamination construction being independent thereby efficiency can be improved.

That is, pattern data are prepared in the same layer as completed pattern of one process layer to construct a semiconductor integrated circuit but as a separated integrated layer in the pattern data to control the exposure apparatus.

Subsequently, in pattern classification and vectorizing processing of step 1104, data are separated in each file of repeated cell 1105 of repeated pattern, non-repeated pattern 1105, subtract pattern 1107 and reference relation 1108 and outputted.

In this case, the repeated cell 1105 is a data file of repeated graphics, and the non-repeated pattern 1106 is a data file of other non-repeated graphics. Also the substrate pattern 1107 is a data file for boundary processing of the repeated pattern and the non-repeated pattern 1106, and the reference relation 1108 is a data file of arrangement development information.

The repeated cell 1105 must be made in patterns extracted in the base of patterns corresponding to plural graphic apertures entering the field to enable the batch transfer in drawing by the electron beam 10. The field to enable the batch transfer is a range within the possible drawing accuracy because of uniformity of the intensity of the electron beam 10. In the drawing by the electron beam 10, there is limitation called Coulomb effect. For example, in the electron beam 10 of the current density of 10 A/cm$^2$, shot size conversion is carried out on the semiconductor wafer 7 and limitation becomes about a maximum 7 μm square.

Consequently, the repeated pattern and its arrangement information correspond to plural graphic apertures entering the field to enable the batch transfer of the repeated unit of plural graphics of a semiconductor integrated circuit or the like. That is, if the field of the repeated pattern is small, data are gathered within the field to enable the batch transfer, and if the field is large, reversely the data processing to divide the data within the field to enable the batch transfer. If the repeated unit of plural graphics of input data corresponds to plural graphic apertures entering the field to enable the batch transfer the data processing time can be reduced depending on this.

In this stage, an exclusive of logic sum EOR of input data and output data is computed and a pattern check is carried out or pattern dimensions are corrected. The pattern check carries out overlap removing processing of non-repeated graphics due to differences between the non-repeated pattern 1106 and the subtract pattern 1107 and the overlap removing processing of repeated graphic due to logic sum of the repeated cell 1105. The dimension correction is to correct dimensional deterioration due to the above-described proximity effect scattering phenomenon of the beam 10 on the semiconductor wafer 7 in the exposure by the electron beam 10.

Subsequently, SLICE step 1109 is to carry out analyzing processing into basic graphics so as to expose the pattern at one time.

Further, SSF (Sub Sub Field) dividing in step 1110 is to divide the electron beam 10 in each field to enable deflection at high speed by the second deflection control described in the exposure method. When the electron beam 10 is subjected to beam deflection at high speed and high precision, such system is used so that the electron beam 10 passes between electrodes to form the electrostatic field to produce electrostatic deflection, and the SSF dividing is carried out because the field of the electrostatic deflection is limited, for example, to about a 100 μm square.

According to the SSF dividing process, data are divided into a file of the repeated pattern and its arrangement information and non-repeated pattern in the SSF unit. That is, the non-repeated pattern file in the SSF unit is divided into graphic pattern file 1111 of patterns within the SSF, pointer table file 1112, SSF array file 1113. On the other hand, the repeated cell is divided into graphic pattern file 1114 of patterns within the SSF, and pointer table file 1115. Here, the pointer table is a storage table file of stored addresses of graphic pattern data.

Thus if the SSF unit possesses non-repeated pattern data and repeated pattern data, the information quantity increases significantly. Therefore, the SSF arrangement possesses the hierarchical structure and also possesses a pointer table having the same size as the SF number of one layer. Thereby the data quantity of a repeated pattern arranged regularly within one chip can be defined as small quantity in the cell pattern of the semiconductor integrated circuit memory.

The SF arrangement in two layers and three layers is linked with pattern data of one layer by a pointer table from the SF arrangement command. In each SF unit, repeated information and non-repeated information are provided only within the field and the graphic information can be requoted in the pointer table.

For example, FIG. 12 shows an example of the SF arrangement in three layers, and such arrangement can be defined as follows.

Command showing SSF arrangement of three layers $X_0$, $Y_0$ center coordinates at SSF being repetition reference $m_3$, $n_3$ three-layer repeated number in X direction and Y direction of SSF $dX_3$, $dY_3$ three-layer repeated pitch in X direction and Y direction of SSF $m_2$, $n_2$ two-layer repeated number in X direction and Y direction of SSF $dX_2$, $dY_2$ two-layer repeated pitch in X direction and Y direction of SSF $m_1$, $n_1$ one-layer repeated number in X direction and Y direction of SSF $dX_1$, $dY_1$ one-layer repeated pitch in X direction and Y direction of SSF PA top address of pointer table of pattern data Subsequently, the array conversion in step 1116 of FIG. 11 carries out conversion processing of the arrangement development information of input pattern data into SSF array 1117. For example. FIG. 13 is an explanation of command specifying the SSF, and the arrangement position or the like of the SSF can be specified in this manner.

Finally, by synthesizing processing in step 1118, the above-mentioned data are synthesized and outputted as the control data (step 1119). In this case, by the assignment, the synthesizing method can be classified into the following three methods.

1) Output data are synthesized and outputted in a continuation of repeated part pattern data and non-repeated part pattern data, in the second beam deflection domain unit or its dividing field unit. This can be adopted to the case where the exposure density of the repeated part pattern and the non-repeated part pattern varies very little.

2) Output data are synthesized and outputted in classifying the repeated part pattern data and the non-repeated part pattern data respectively, in the second beam deflection field unit or its dividing field unit. In the case that the exposure density varies usually in the repeated part pattern and the non-repeated part pattern, since the current density of the electron beam 10 is corrected and dependent on this, excessive time is required by two orders of magnitude in comparison with the irradiation time to correct the exposure time of the electron beam 10 and the irradiation position of the electron beam 10. This method can reduce the exposure time by respective classification.

3) Output data are separated in the moving unit of the second mask 16 and outputted, corresponding to the second mask 16. Since the irradiation position of the electron beam 10 and the position of the semiconductor wafer 7 must be calibrated dependent on the moving of the second mask 16, this method calibrates the reference position of the second beam deflection field in the reference mark on the semiconductor wafer 7 or on the platform 8 mounting the sample, in providing the time reduced further by about two orders of magnitude in comparison with the above-mentioned 2).

In order to change the above-mentioned three synthesizing methods simply, output data can be processed by adding the pointer table data for continuing, classifying, dividing and synthesizing, in the second beam deflection domain unit or its dividing field unit.

Also output data are data that a graphic aperture part corresponding to repetition of graphics is extracted (so as to select a part of plural graphic apertures of the second mask 16 by the deflection control of electron beam 10 passing through the first mask 11) and the name or identification code corresponding to graphic apertures of the second mask 16 and the position coordinates of the transfer pattern corresponding to a position on the semiconductor wafer 7 are made components. The remaining pattern part due to the extraction (so as to vary the beam dimension by the deflection control of the electron beam 10 passing through the rectangular apertures of the first mask 11 and the second mask 16) is made data in components of the beam dimensions and the position coordinates corresponding to a position on the semiconductor wafer 7.

Further output data, formed in that repeated part of the graphic information, are extracted corresponding to graphic apertures (so as to select a part of plural graphic apertures of the second mask 16 by the deflection control of the electron beam 10 passing through the first mask 11). Pattern data in components of the name or identification code corresponding to a part of plural graphic apertures of the second mask 16 and the position coordinates of the transfer pattern corresponding to a position on the semiconductor wafer 7 and pattern data of the remaining pattern part of the extraction (so as to vary the beam dimension by the deflection control of the electron beam 10 passing through the rectangular apertures of the first mask 11 and the second mask 16) in components of the beam dimension and the position coordinates corresponding to a position on the semiconductor wafer 7 are synthesized and outputted to a storage apparatus such as a magnetic disc.

For example, in order to assign one graphic data, parameters of graphic assignment by a variable size rectangular beam are set as shown in FIG. 14, and on the other hand, in order to assign graphics by batch a transfer beam, parameters are set as shown in FIG. 15. In this case, in order to compress the pattern data amount, each bit is given with a significance to ½ word (15 bits) column.

Output data in combination of the parameters are a part of format of the graphic processing command allowed by the drawing apparatus. Also assignment with delimiter provided between parameters (3) and (4) in FIG. 14 is defined, thereby when parameters (1)–(4) are the same, for example, before (3), the data amount can be further reduced by referring to parameter immediately before it.

Here, in data for the batch transfer beam shown in FIG. 15, since data corresponding to (1), (2) in the case of the variable rectangular dimension beam shown in FIG. 14 do not have significance, they are deleted so as to reduce the data amount.

Thus for plural graphic apertures of the second mask 16, the name or code is provided corresponding to respective graphic apertures transferred at one time and the input pattern data to the pattern drawing apparatus include the name or code, thereby the mask pattern inspection as hereinafter described can be carried out automatically.

Also for plural graphic apertures of the second mask 16, the relative position between pattern data corresponding to respective graphic apertures transferred at one time and pattern data formed by the rectangular aperture of the second mask 16 is made changeable, thereby, for example, changing from the plural graphic apertures of the second mask 16 to graphic apertures with the pattern dimensions changed becomes easy. That is, the second mask 16 and the pattern data can be used efficiently.

As above-described, output data are characterized in that respective part of the graphic information is extracted corresponding to graphic apertures (so as to select a part of plural graphic apertures of the second mask 16 by the first deflection control of the electron beam 10 passing through the first mask 11), and the name or identification code corresponding to the aperture pattern of the second mask 16 and the position coordinate data of the transfer pattern corresponding to a position on the semiconductor wafer 7 and repeated data thereof are made components and pattern data are formed, and a remaining pattern part of the extraction (so as to vary the beam dimension passing through the rectangular aperture of the second mask 16 by the first deflection control of the electron beam 10 passing through the first mask 11) is pattern data in components of the beam dimensions or the dimension data corresponding to this and the position coordinate data corresponding to a position on the semiconductor wafer 7.

Further, the preparation of pattern data can be carried out automatically, for example, in that the software program is implemented in a computer of a work station or the like.

That is, the automation becomes possible in that pattern data including repetition of information of plural graphics of a semiconductor integrated circuit or the like or data with the graphic information being specified are previously inputted to a magnetic disc of a computer in a work station or the like, and the data are read and processed according to the data preparation method as above-described. The point of the processing is in that the repeated part of the graphic information is extracted corresponding to the graphic apertures.

In the computer system in this case, input data are pattern data including repetition of information of plural graphics of a semiconductor integrated circuit or the like or data with the graphic information being specified, and the data are temporarily stored through a medium such as a magnetic tape or a communication apparatus to a storage apparatus such as a magnetic disc.

Output data are characterized in that a repeated part or the graphic information is extracted corresponding to graphic apertures (so as to select a part of plural graphic apertures of the second mask 16 by the first deflection control of the electron beam 10 passing through the first mask 11), and pattern data in components of the name or identification code corresponding to a part of plural graphic apertures of the second mask 16 and the position coordinate data of the transfer pattern corresponding to a position on the semiconductor wafer 7 and repeated data thereof and petition data of the remaining pattern part of the extraction (so as to vary the beam dimension passing through the rectangular aperture of the second mask 16 by the first deflection control of the electron beam 10 passing through the first mask 11) in components of the beam dimension or the dimension data corresponding to this and the position coordinate data corresponding to a position on the semiconductor wafer 7 are synthesized and outputted to the storage apparatus such as a magnetic disc.

Further, the computer system may be in combined use with the control computer 21 of the exposure apparatus of the electron beam 10 or a separate computer may be used. In the case of the separate computer, it is on-line connected to the control computer 21 of the exposure apparatus thereby efficiency can be improved.

Thus the pattern data can be prepared in a mixed state of pattern data for batch transfer and pattern data for variable rectangular shape.

As above-described, a pattern data preparation method to be used for an exposure apparatus in batch transfer system can be realized easily, and batch transfer of desired batch transfer aperture patterns (number 1-5) is carried out by irradiation of the electron beam 10 shaped by a combination of the first mask 11 and the second mask 16, thereby improvement of throughput can be realized.

Pattern data to be used for a mask having plural graphic apertures are separated from patterns of an integrated circuit or the like and made an independent layer in lamination structure so that efficiency of pattern data preparation can be improved.

Next, referring to FIG. 16, pattern data for control and an example of a control method using the pattern data will be described. Here, method of deflecting the electron beam 10 and controlling the shot position shall be shown.

First, from the buffer memory 23 of the control I/O section 2 shown in FIG. 1, data in the base shot position in (3) of FIGS. 14, 15 are outputted by the processing unit 24 by codes comprising an upper bit column or lower bit column included in the pattern data.

Data in the beam shot position may only delete the code data as above-described, thereby data processing can be carried out at high speed.

The data are saved temporarily in a register (REG) 61, and timing with position of the stage 8 or control of other electron beam 10 is adjusted, and an analog voltage corresponding to bit data in the shot position is outputted by a digital/analog converter (DAC) 62.

Further, the analog voltage is subjected to voltage adjustment by operation amplifiers (A1) 63, (A2) 64, and then applied to a beam deflection electrode 65. The pattern data of the graphic command in FIGS. 14, 15 can be converted into a voltage of the beam deflection electrode 65 for controlling the position coordinates.

A system similar to the above can be applied to the first deflection control for selecting batch transfer apertures and variable rectangular apertures of the second mask 16, the second deflection control for selecting a part of the variable rectangular apertures.

In this case, the first deflection control and the second deflection control are separated, because the deflection width of the electron beam 10 is different and therefore specification of the necessary deflection control circuit is difficult. That is, in order to improve precision with the same resolution, for example, a setting time of digital/analog conversion of the digital/analog converter 62 is varied. If the first deflection control also serves for the second deflection control, precision of the deflection control is diminished or excessive time is required.

Consequently, in order to realize the exposure as a feature of the exposure method according to the present invention, the first deflection control and the second deflection control are separated, thereby the exposure precision and the exposure speed can be improved.

Next, referring to FIG. 17, an inspection method of the second mask 16 used for the exposure method of the present invention will be described.

In this case, inspection of plural graphic patterns for batch transfer of the second mask 16 uses a sensor 71 for detecting a quantity of charged particles such as reflected electrons or secondary electrons generated during scanning the second mask 16 by the electron beam 10 which is positioned between the electron lens 13 and the second mask 16. The detected signals are subjected to data processing.

An output from the sensor 71 is one input of a comparator 74 through an amplifier 72 and a changeover switch 73. Memory 75 for storing measured data through the changeover switch 73 is connected to other input of the comparator 74 through a changeover switch 76. Further, a memory 78 for storing design data of batch transfer aperture positions (number 1-5) in the second mask 15 is also connected to the changeover switch 76.

When the second mask 16 is first used, the electron beam 10 passing through the first mask 11 scans the aperture pattern 16a of the second mask 16 by control of the beam deflector 15 and the electron lens 13 of beam shaping, and detection signal of charged particles which are obtained is then stored in the memory 75.

Then, while a part of plural aperture patterns 16a on the second mask 16 is selected, by comparison with detection signals held in the memory 75, inspection for deterioration of shape and type of the selected batch transfer aperture patterns (number 1-5) is carried out. The inspection for deterioration of shape is to investigate deterioration of the graphic apertures of the second mask 16 by irradiation of the electron beam 10 and for making a decision regarding whether continued use is possible or not.

The detection signal during the transfer work can be compared with the design data 77 of the batch transfer aperture patterns (number 1-5) of the second mask 16. However, since the detection signal of the actual pattern of the second mask 16 and the signal obtained from the design data 77 are different in roundness of the pattern corner part for example, data processing to deal with this is applied if necessary.

Further, in place of the pattern detection by the sensor 71, the batch transfer aperture patterns (number 1-5) of the second mask 16 may be detected by transmission type SEM (Scanning Electron Microscope) system. That is, the aperture patterns 16a of the second mask 16 are scanned by control of the second deflector 15 and the electron lens 13, and the transmitted electron beam 10 can be detected by the beam detector 79 on the stage 8. The data processing method of the detection signal is carried out in similar manner to the above.

In the pattern data in the embodiment as above-described, for plural graphic aperture of the second mask 16, the name or code is provided corresponding to respective graphic apertures transmitted at one time, and data to make pattern data inputted to the pattern drawing apparatus include the name or code. That is, in FIG. 15, a code of the batch transfer patterns is provided corresponding to the batch transfer apertures.

Since the pattern data have an ID of transfer mask patterns corresponding to respective graphic apertures, checking before the drawing of whether the transfer mask pattern is suitable or not can be performed.

Thus in this embodiment, a shape or type of the aperture pattern 16a of the second mask 16 can be inspected, and, for example, a mistake of the transfer work caused by foreign matter adhering to the second mask 16, an error in changing of the second mask 16, an error selection of the aperture pattern 16a and the like can be prevented. This is particularly effective to maintain and improve the reliability of the pattern transfer work in the mass production process using a number of the second masks 16.

Although the invention has been described concretely based on the embodiments, the invention is not limited by the embodiments but may be, of course, variously changed without departing from its spirit and scope.

For example, the electron beam optical system 5 of the exposure apparatus of the embodiment is not limited to examples in FIG. 1 and FIG. 3 and other constructions may be used.

As an example of pattern transfer, the code to be applied to the exposure process of the semiconductor wafer 7 has been described, but it can be applied, of course, to usual processing technology using charged particle beam shaped by a mask.

Effects obtained by the invention are briefly described as follows.

(1) According to the exposure method and the exposure apparatus of the present invention, when patterns including repetition of plural graphics are exposed, the first mask having a rectangular aperture and the second mask having at least one rectangular aperture and plural graphic apertures are interposed in sequence in the path of the focused beam from the beam source to a sample, and repeated patterns of information of plural graphics are formed in that a part of plural graphic apertures of the second mask are selected by the first deflection control and the focused beam passing through the first mask is irradiated on a desired position of the sample by the second deflection control, and non-repeated patterns of the graphic information are formed in that dimensions of the beam passing through the rectangular aperture of the second mask are varied by the first deflection control and the focused beam passing through the first mask is irradiated to a desired position on the sample by the second deflection control. Thereby according to the pattern density a link between repeated pattern of graphics and non-repeated pattern or a link between different repeated patterns, the first deflection control and the second deflection control are corrected within the range of the corresponding second deflection control and the beam irradiation is carried out onto the sample continuously or in continued state of necessary correction and the resultant pattern can be formed, thereby selective exposure of desired pattern becomes possible.

(2) According to the pattern data preparation method used for the exposure method, when a system of transferring the mask image using the focused beam is applied to the semiconductor integrated circuit device, pattern data for the transfer of an aperture mask of pattern shape and for the drawing of the variable shaping beam can be prepared efficiently.

(3) In addition to (2) above, aperture mask data of pattern shape particularly having an independent layer in a lamination structure are formed. Since pattern data can be prepared easily, the preparation efficiency is improved.

(4) According to a mask for the exposure method, when transfer is carried out by a selection from an aperture mask in shape of plural patterns, since the mask pattern cannot be seen directly, although the selection error of the aperture mask may be produced with high probability in the prior art, since check using the name or code of the mask pattern becomes possible in the present invention, inspection of the aperture pattern formed in the mask can be carried out securely.

(5) According to (4) above, particularly the name or code of the mask pattern is used so that the exposure technology to enable automatic checking of exchange of plural types of the batch transfer mask can be obtained.

(6) According to (1)-(5) above, in the pattern transfer by the repeated pattern and the non-repeated pattern, the exposure technology to enable the selective pattern exposure with high reliability by desired resultant pattern can be obtained.

What is claimed is:

1. A method of exposing a plate-like substrate to an electron beam comprising the steps of:
  (a) positioning a first mask having a rectangular opening between a source of the electron beam and the plate-like substrate;
  (b) positioning a second mask between the first mask and the plate-like substrate, the second mask having a group of apertures including
    (i) a rectangular aperture to define a desired rectangular shaped beam together with the rectangular opening in the first mask and
    (ii) a plurality of predetermined shaped apertures substantially different in shape or size from the rectangular aperture in the second mask; and
  (c) passing the electron beam from the source through the rectangular opening in the first mask and through the rectangular aperture or one of the predetermined shaped apertures in the second mask, and then irradiating the plate-like substrate with the passed electron beam while the plate-like substrate is continuously in motion.

2. A method according to claim 1, including moving said second mask between the first mask and the plate-like substrate during said positioning of said second mask.

3. A method according to claim 2 wherein said second mask which is moved is provided with said rectangular aperture disposed adjacent to said plurality of predetermined shaped apertures in said group of apertures in said second mask.

4. A method according to claim 3 wherein in said second mask which is moved each of said plurality of predetermined shaped apertures includes one or more openings.

5. A method of exposing an electron sensitive resist film overlying a surface of an integrated circuit wafer to an electron beam comprising the steps of:
   (a) positioning a first mask having a rectangular opening between a source of the electron beam and the resist film;
   (b) positioning a second mask between the source and the resist film, the second mask having a group of apertures including
      (i) a rectangular aperture to define a desired rectangular shaped beam together with the rectangular opening in the first mask and
      (ii) a plurality of graphic apertures corresponding to a device pattern or patterns over said surface of the wafer and substantially difference in shape or size from the rectangular aperture in the second mask; and
   (c) passing the electron beam from the source both through the rectangular opening in the first mask and through the rectangular aperture or one of said graphic apertures in the second mask, and then irradiating the resist film overlying said surface of the wafer with the passed electron beam while the wafer is continuously in motion along a direction on a plane substantially perpendicular to the electron beam.

6. A method according to claim 5, including moving said second mask between the first mask and the wafer during said positioning of said second mask.

7. A method according to claim 6 wherein said rectangular aperture is disposed adjacent to said plurality of device-shaped apertures.

8. A method according to claim 7 wherein each device-shaped aperture includes one or more openings.

9. A method according to claim 5 wherein said surface of said wafer is a major surface.

10. A method of exposing an electron beam sensitive resist film overlying a surface of a plate-like substrate to an electron beam comprising the steps of:
    (a) positioning a first mask having a rectangular opening between a source of the electron beam and the resist film;
    (b) positioning a second mask between the source and the resist film, the second mask having a group of apertures including
       (i) a rectangular aperture to define a desired rectangular shaped beam together with the rectangular opening in the first mask and
       (ii) a plurality of predetermined shaped apertures substantially different in shape or size from the rectangular aperture in the second mask; and
    (c) passing the electron beam from the source both through the rectangular opening in the first mask and through the rectangular aperture or one of the predetermined shaped apertures in the second mask, and then irradiating the resist film overlying said surface of the plate-like substrate with the electron beam while the plate-like substrate is continuously in motion along a direction on a plane substantially perpendicular to the electron beam.

11. A method according to claim 10, including moving said second mask between the first mask and the plate-like substrate during said positioning of said second mask.

12. A method according to claim 11 wherein said rectangular aperture is disposed adjacent to said plurality of predetermined shaped apertures in said group of apertures in said second mask.

13. A method according to claim 12 wherein each of said plurality of predetermined shaped apertures includes one or more openings.

14. A method of exposing an electron sensitive resist film overlying a surface of an integrated circuit wafer to an electron beam comprising the steps of:
    (a) positioning a first mask having a rectangular opening between a source of the electron beam and the resist film;
    (b) positioning a second mask between the source and the resist film, the second mask having
       (i) a first group of apertures including
          (1) a rectangular aperture to define a desired rectangular shaped beam together with the rectangular opening in the first mask and
          (2) a first set of graphic apertures corresponding to a pattern or patterns over said surface of the wafer, and
       (ii) a second group of apertures including
          (1) a rectangular aperture to define a desired rectangular shaped beam together with the rectangular opening in the first mask and
          (2) a second set of graphic apertures, which includes at least one aperture different from the graphic apertures in the first group in shape or orientation, corresponding to a pattern or patterns over said surface of the wafer; and
    (c) passing the electron beam from the source both through the rectangular opening in the first mask and through the rectangular aperture or one of said graphic apertures in one of the first and second groups in the second mask, and then irradiating with the resist film overlying said surface of the wafer with the electron beam while the wafer is continuously in motion along a direction on a plane substantially perpendicular to the electron beam.

15. A method according to claim 14, including moving said second mask between the first mask and the wafer during said positioning of said second mask.

16. A method according to claim 15 wherein each rectangular aperture is disposed adjacent to the device-shaped apertures within the same group.

17. A method according to claim 16 wherein each device-shaped aperture includes one or more openings.

18. A method according to claim 14 wherein the device-shaped apertures are substantially different in shape or size from the rectangular aperture within the same group.

19. A method of exposing an electron sensitive resist film overlying a surface of a plate-like substrate to an electron beam comprising the steps of:
    (a) positioning a first mask having a rectangular opening between a source of the electron beam and the resist film;
    (b) positioning a second mask between the source and the resist film, the second mask having
       (i) a first group of apertures including
          (1) a rectangular aperture to define a desired rectangular exposure pattern together with the rectangular opening in the first mask, and (2) a set of predetermined shaped apertures, and
(ii) a second group of apertures including
(1) a rectangular aperture to define a desired rectangular exposure pattern together with the rectangular opening in the first mask and
(2) a set of predetermined shaped apertures, which includes at least one aperture different from the predetermined shaped apertures in the first group in shape or orientation; and
(c) passing the electron beam from the source both through the rectangular opening in the first mask and through the rectangular aperture or one of said predetermined shaped apertures in one of the first and second groups in the second mask, and then irradiating the resist film overlying said surface of the plate-like substrate with the electron beam while the plate-like substrate is continuously in motion along a direction on a plane substantially perpendicular to the electron beam.

20. A method according to claim 19, including moving said second mask between the first mask and the plate-like substrate during said positioning of said second mask.

21. A method according to claim 20 wherein each rectangular aperture is disposed adjacent to the predetermined shaped apertures within the same group.

22. A method according to claim 21 wherein each predetermined shaped aperture includes one or more openings.

23. A method according to claim 19 wherein the predetermined shaped apertures are substantially different in shape or size from the rectangular aperture within the same group.

24. A method of exposing an electron sensitive resist film overlying a surface of an integrated circuit wafer to an electron beam comprising the steps of:
(a) positioning a first mask having a rectangular opening between a source of the electron beam and the resist film;
(b) positioning a second mask between the source and the resist film, the second mask having
(i) a first group of apertures, disposed adjacent to each other, including
(1) a rectangular aperture to define a desired rectangular exposure pattern together with the rectangular opening in the first mask and
(2) a first set of graphic apertures corresponding to a device pattern or patterns over said surface of the wafer, and
(ii) a second group of apertures, disposed adjacent to each other, including
(1) a rectangular aperture to define a desired rectangular exposure pattern together with the rectangular opening in the first mask and
(2) a second set of graphic apertures, which includes at least one aperture different from the graphic apertures in the first group in shape or orientation, corresponding to a pattern or patterns over said surface of the wafer; and
(c) passing the electron beam from the source both through the rectangular opening in the first mask and through the rectangular aperture or one of the graphic apertures in one of the first and second groups in the second mask, and then irradiating the resist film overlying said surface of the wafer with the passed electron beam.

25. A method according to claim 24, including moving said second mask between the first mask and the wafer during said positioning of said second wafer.

26. A method according to claim 25 wherein each rectangular aperture is disposed adjacent to the device-shaped apertures within the same group.

27. A method according to claim 26 wherein each device-shaped aperture includes one or more openings.

28. A method according to claim 24 wherein the device-shaped apertures are substantially different in shape or size from the rectangular aperture within the same group.

29. A method of exposing an electron sensitive resist film overlying a surface of a plate-like substrate to an electron beam comprising the steps of:
(a) positioning a first mask having a rectangular opening between a source of the electron beam and the resist film;
(b) positioning a second mask between the source and the resist film, the second mask having
(i) a first group of apertures including
(1) a rectangular aperture to define a desired rectangular exposure pattern together with the rectangular opening in the first mask and
(2) a set of predetermined shaped apertures, and
(ii) a second set of apertures including
(1) a rectangular aperture to define a desired rectangular exposure pattern together with the rectangular opening in the first mask and
(2) a set of predetermined shaped apertures, which includes at least one aperture different from the predetermined shaped apertures in shape or orientation; and
(c) passing the electron beam from the source both through the rectangular opening of the first mask and through the rectangular aperture or predetermined shaped apertures in one of the first and second groups in the second mask, and then irradiating the resist film overlying said surface of the plate-like substrate with the passed electron beam.

30. A method according to claim 29, including moving said second mask between the first mask and the plate-like substrate during said positioning of the second mask.

31. A method according to claim 30 wherein each rectangular aperture is disposed adjacent to the predetermined shaped apertures within the same group.

32. A method according to claim 31 wherein each predetermined shaped apertures includes one or more openings.

33. A method according to claim 29 wherein the predetermined shaped apertures are substantially different in shape or size from the rectangular aperture within the same group.

34. A method of exposing an electron sensitive resist film overlying a surface of an integrated circuit wafer to an electron beam comprising the steps of:
(a) positioning a first mask having a rectangular opening between a source of the electron beam and the resist film;
(b) positioning a second mask between the source and the resist film, the second mask
(i) having a first group of apertures including
(1) a rectangular aperture to define a desired rectangular exposure pattern together with the rectangular opening in the first mask and
(2) a first set of graphic apertures corresponding to a pattern or patterns over said surface of the wafer, and
(ii) a second group of apertures including
(1) a rectangular aperture to define a desired rectangular exposure pattern together with the first rectangular opening in the first mask and (2) a second set of graphic apertures, which includes at least one aperture different from the the graphic apertures in the first group in shape or orientation, corresponding to a pattern or patterns over said surface of the wafer;

(c) passing the electron beam from the source both through the rectangular opening of the first mask and through the rectangular aperture or one of the graphic apertures in one of the first and second groups in the second mask and then irradiating the resist film overlying said surface of the wafer with the passed electron beam;

(d) displacing the second mask so that the other of the first and second groups in the second mask can be selected by the electron beam; and (e) passing the electron beam from the source both through the rectangular opening in the first mask and through the rectangular aperture or one of the graphic apertures in the other of said first and second groups in the second mask, and then irradiating the resist film overlying said surface of the wafer to expose the resist film with the passed electron beam.

35. A method according to claim 34, including moving said second mask between the first mask and the wafer during said positioning of said second mask.

36. A method according to claim 35 wherein each rectangular aperture is disposed adjacent to the device-shaped apertures within the same group.

37. A method according to claim 36 wherein each device-shaped aperture includes one or more openings.

38. A method according to claim 34 wherein the device-shaped apertures are substantially different in shape or size from the rectangular aperture within the same group.

39. A method of exposing an electron sensitive resist film overlying a surface of a plate-like substrate to an electron beam comprising the steps of:

(a) positioning a first mask having a rectangular opening between a source of the electron beam and the resist film;

(b) positioning a second mask between the source and the resist film, the second mask having
  (i) a first group of apertures including
    (1) a rectangular aperture to define a desired rectangular exposure pattern together with the rectangular opening in the first mask and
    (2) a set of predetermined shaped apertures corresponding to a pattern or patterns over said surface of the plate-like substrate, and
  (ii) a second group of apertures including
    (1) a rectangular aperture to define a desired rectangular exposure pattern together with the first rectangular opening in the first mask and
    (2) a set of predetermined shaped apertures, which includes at least one aperture different from the predetermined shaped apertures in the first group in shape or orientation;

(c) passing the electron beam from the source both through the rectangular opening of the first mask and through the rectangular aperture or one of the predetermined shaped apertures in one of the first and second groups in the second mask, and then irradiating the resist film overlying said surface of the plate-like substrate to expose the resist film with the electron beam;

(d) displacing the second mask so that the other of the first and second groups can be selected by the electron beam; and (e) passing the electron beam from the source both through the rectangular opening in the first mask and through the rectangular aperture or one of the predetermined shaped apertures in the other of the first and second groups in the second mask, and then irradiating the resist film overlying said surface of the plate-like substrate with the passed electron beam.

40. A method according to claim 39, including moving said second mask between the first mask and the plate-like substrate during said positioning of said second mask.

41. A method according to claim 40 wherein each rectangular aperture is disposed adjacent to the predetermined shaped apertures within the same group.

42. A method according to claim 41 wherein each predetermined shaped aperture includes one or more openings.

43. A method according to claim 39 wherein the predetermined shaped apertures are substantially different in shape or size from the rectangular aperture within the same group.

* * * * *